(12) United States Patent
Hsiang et al.

(10) Patent No.: US 11,380,658 B2
(45) Date of Patent: Jul. 5, 2022

(54) DISPLAY DEVICE AND MANUFACTURING METHOD THEREOF

(71) Applicant: Acer Incorporated, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 16/988,131

(22) Filed: Aug. 7, 2020

(65) Prior Publication Data

US 2021/0343682 A1 Nov. 4, 2021

(30) Foreign Application Priority Data

May 4, 2020 (TW) ................................. 109114769

(51) Int. Cl.
*H01L 25/075* (2006.01)
*H01L 33/62* (2010.01)
*H01L 27/12* (2006.01)

(52) U.S. Cl.
CPC ...... *H01L 25/0753* (2013.01); *H01L 27/1214* (2013.01); *H01L 33/62* (2013.01); *H01L 2933/0016* (2013.01); *H01L 2933/0033* (2013.01); *H01L 2933/0066* (2013.01)

(58) Field of Classification Search
CPC . H01L 25/0753; H01L 27/1214; H01L 33/62; H01L 2933/0016; H01L 2933/0033; H01L 2933/0066; H01L 27/156; H01L 25/167

See application file for complete search history.

(56) References Cited

U.S. PATENT DOCUMENTS

| 7,482,746 B2 | 1/2009 | Ogawa et al. |
| 9,966,420 B2 | 5/2018 | Kim |
| 2007/0029554 A1* | 2/2007 | Nakamura .......... H01L 27/3288 257/E27.111 |

(Continued)

FOREIGN PATENT DOCUMENTS

| TW | 200304028 A | 9/2003 |
| TW | I663724 B | 6/2019 |
| TW | I676284 B | 11/2019 |

OTHER PUBLICATIONS

Chinese language office action dated Nov. 6, 2020, issued in application No. TW 109114769.

*Primary Examiner* — Victor A Mandala
(74) *Attorney, Agent, or Firm* — McClure, Qualey & Rodack, LLP

(57) ABSTRACT

A manufacturing method of a display device is provided. The manufacturing method of the display device includes forming a switching structure. The switching structure includes a plurality of switching elements. The manufacturing method of the display device also includes forming a light-emitting structure. The light-emitting structure includes a plurality of light-emitting elements. The manufacturing method of the display device further includes arranging the light-emitting structure on the switching structure, so that each of the light-emitting elements is above each of the switching elements. The manufacturing method of the display device includes connecting each of the light-emitting elements to a corresponding switching element via a laser.

10 Claims, 22 Drawing Sheets

(56) References Cited

U.S. PATENT DOCUMENTS

| | | | |
|---|---|---|---|
| 2007/0120476 A1* | 5/2007 | Park | H01L 27/124 |
| | | | 313/506 |
| 2011/0012880 A1* | 1/2011 | Tanaka | H01L 27/1214 |
| | | | 257/E29.345 |
| 2015/0144904 A1* | 5/2015 | Jeong | H01L 27/3262 |
| | | | 438/4 |
| 2019/0027549 A1* | 1/2019 | Ai | H01L 27/3276 |
| 2019/0172760 A1* | 6/2019 | Hsiang | H01L 22/22 |
| 2019/0174595 A1* | 6/2019 | Hsiang | H01L 27/156 |
| 2020/0035750 A1* | 1/2020 | Li | G09G 3/3208 |
| 2020/0083256 A1* | 3/2020 | Yoshida | H01L 29/78633 |
| 2020/0212279 A1* | 7/2020 | Son | H01L 33/52 |
| 2020/0287093 A1* | 9/2020 | Tan | H01L 33/44 |
| 2020/0313035 A1* | 10/2020 | Lee | H01L 24/32 |
| 2020/0328332 A1* | 10/2020 | Song | H01L 33/56 |
| 2021/0111148 A1* | 4/2021 | Chen | H01L 24/83 |
| 2021/0265327 A1* | 8/2021 | Koo | H01L 33/62 |
| 2021/0335752 A1* | 10/2021 | Huang | H01L 24/94 |
| 2021/0336095 A1* | 10/2021 | Chen | H01L 33/502 |

* cited by examiner

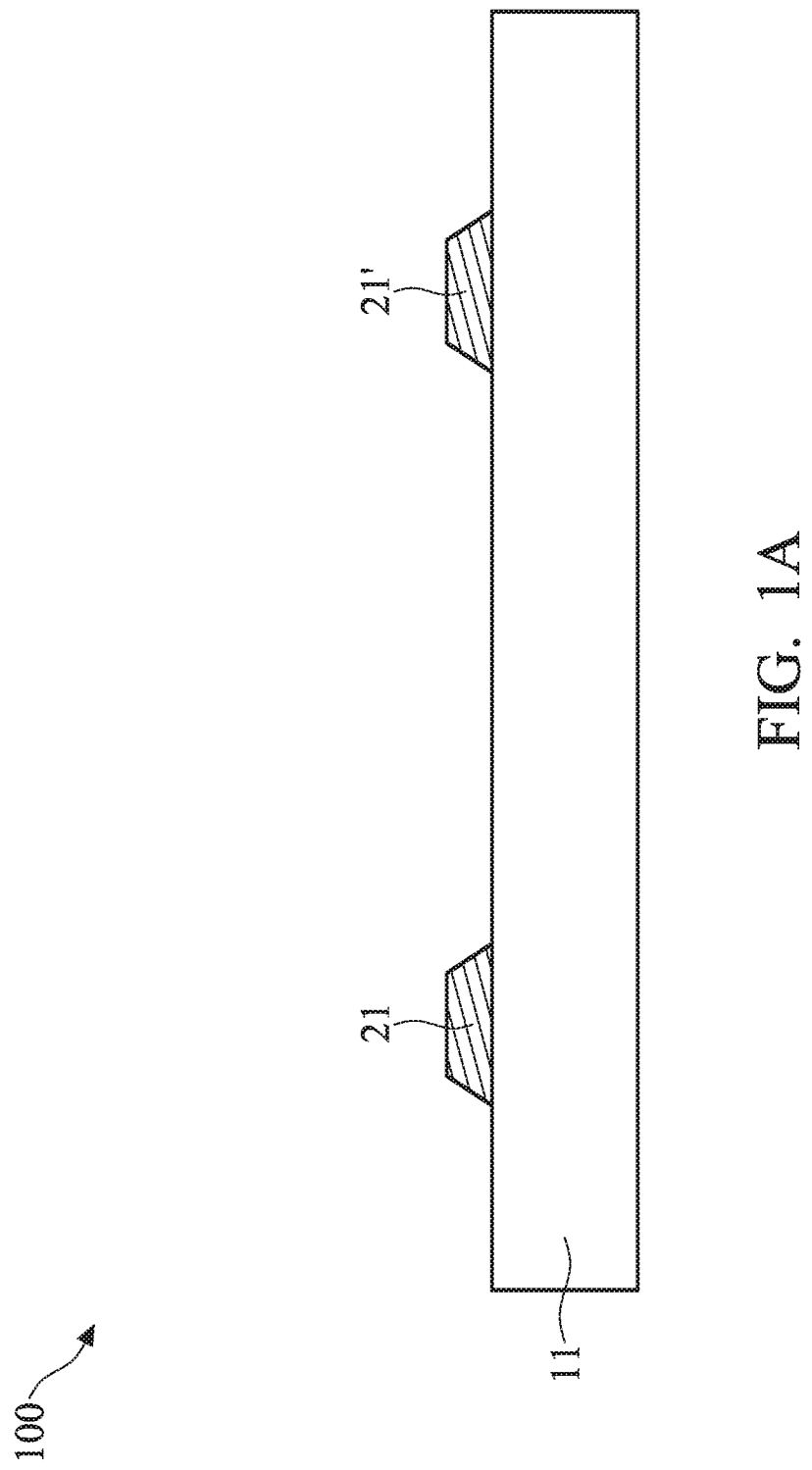

DISPLAY DEVICE AND MANUFACTURING METHOD THEREOF

CROSS REFERENCE TO RELATED APPLICATIONS

This application claims the benefit of Taiwan Application No. 109114769, filed May 4, 2020, the entirety of which is incorporated by reference herein.

BACKGROUND

Technical Field

Embodiments of the present disclosure relate to a display device and a manufacturing method thereof, and in particular they relate to a display device with high resolution and a manufacturing method thereof.

Description of the Related Art

Light-emitting diodes (LED) have the advantages of high brightness, high contrast, wide-viewing angle, long life, low power consumption and so on. Therefore, light-emitting diodes have been widely used in display devices. With the technological improvement of light-emitting diodes, the development of micro-based light-emitting diodes (micro-LED, mLED, or μLED), for example, is attractive, and it is expected that these micro-based light-emitting diodes will be applied to high-quality, high-resolution display devices. However, there are many technical challenges in the implementation of light-emitting diodes.

For example, flip-chip bonding or wire bonding is generally used to bond a micro LED chip to a driving circuit to achieve pixel display light emission. As a result, the size of the micro LED chip is limited and cannot be reduced any further, making it impossible to achieve a high resolution. Although the use of die transfer and photolithography techniques may allow smaller-sized micro LED chip to be bonded to the driving circuit, it requires a more complicated process and uses more photomasks, resulting in higher manufacturing costs.

BRIEF SUMMARY

The embodiments of the present disclosure relate to a display device with high resolution and a manufacturing method thereof. Through the manufacturing method according to the embodiments of the present disclosure, the light-emitting elements of the light-emitting structure (e.g., a structure including micro LED chips) may be stacked on the corresponding switching elements in the switching structure (e.g., a structure including thin film transistor (TFT)), which may effectively reduce the size of a single pixel to achieve high resolution. Moreover, the manufacturing method according to the embodiments of the present disclosure does not require a complicated process or the use of more photomasks. That is, the display device with high resolution may be completed at a lower manufacturing cost.

In accordance with some embodiments of the present disclosure, a manufacturing method of a display device is provided. The manufacturing method of the display device includes forming a switching structure. The switching structure includes a plurality of switching elements. The manufacturing method of the display device also includes forming a light-emitting structure. The light-emitting structure includes a plurality of light-emitting elements. The manufacturing method of the display device further includes arranging the light-emitting structure on the switching structure, so that each of the light-emitting elements is above each of the switching elements. The manufacturing method of the display device includes connecting each of the light-emitting elements to a corresponding switching element via a laser.

In accordance with some embodiments of the present disclosure, a display device is provided. The display device includes a switching structure that includes a plurality of switching elements. The display device also includes a light-emitting structure disposed on the switching structure, and the light-emitting structure includes a plurality of light-emitting elements. Each of the light-emitting elements is disposed correspondingly on one of the switching elements, and each of the light-emitting elements is connected to the corresponding switching element.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

FIGS. 1A-1F are cross-sectional views illustrating various stages of manufacturing the switching structure according to one embodiment of the present disclosure.

DETAILED DESCRIPTION

Figure 1B:
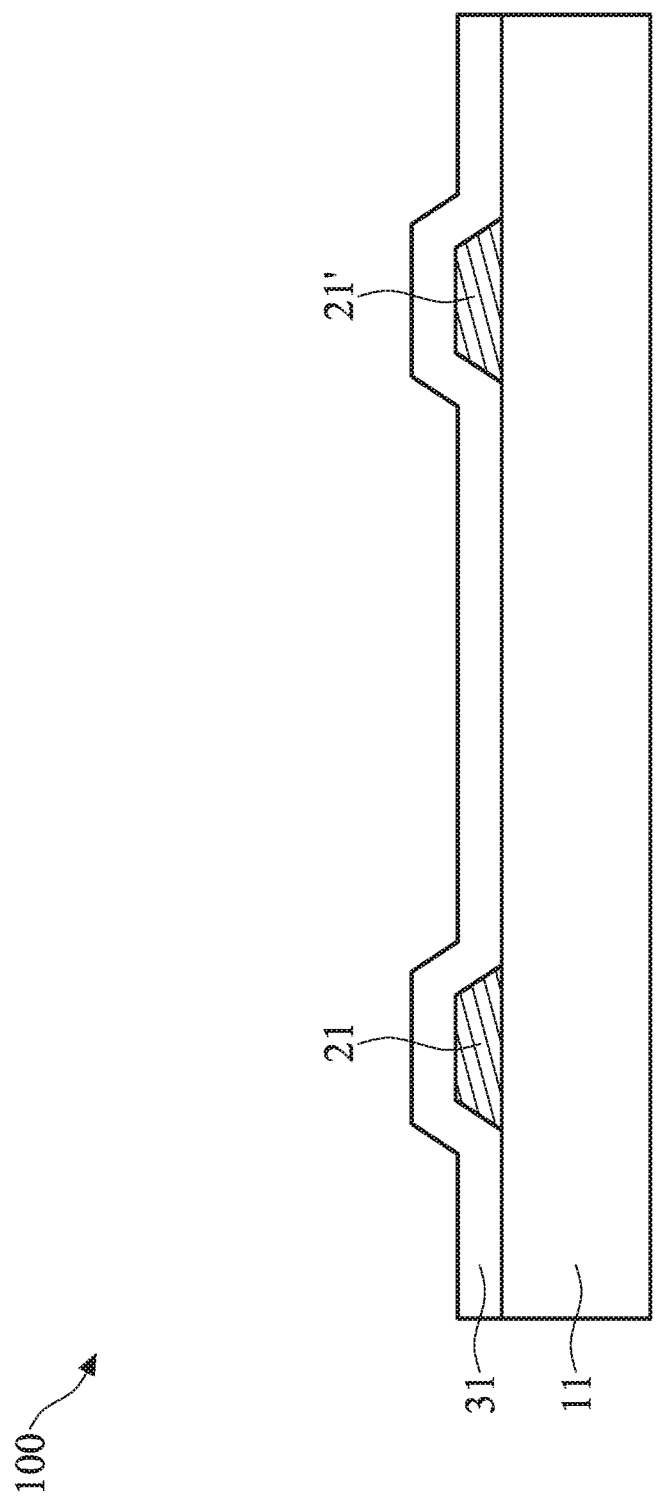

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In the embodiments of the present disclosure, a manufacturing method of a display device is provided. The manufacturing method includes forming a switching structure including a plurality of switching elements (e.g., film transistor (TFT)) and forming a light-emitting structure including a plurality of light-emitting elements (e.g., micro LED chips), and each light-emitting element is connected to a corresponding switching element via a laser. That is, in the manufacturing method of the display device according to the embodiments of the present disclosure, the light-emitting structure is stacked on the corresponding switching structure, so that each light-emitting element is disposed on the corresponding switching element, which may effectively reduce the size of a single pixel to achieve high resolution.

Moreover, since each light-emitting element is connected to the corresponding switching element via a laser in the manufacturing method of the display device according to the embodiments of the present disclosure, it does not require a complicated process or use more photomasks. As a result, a display device with high resolution may be completed at a lower manufacturing cost. The following will explain in detail, accompanied by the drawings.

FIGS. 1A-1F are cross-sectional views illustrating various stages of manufacturing the switching structure 100 according to one embodiment of the present disclosure. It should be noted that some components may be omitted in FIGS. 1A-1F in order to more clearly show the technical features of the embodiments of the present disclosure.

Referring to FIG. 1A, a switching substrate 11 is provided. In some embodiments, the material of the switching substrate 11 may include glass, sapphire, any other applicable material, or a combination thereof, but the present disclosure is not limited thereto.

Referring to FIG. 1A, a plurality of first conductive members 21 (only one first conductive member 21 is shown in FIG. 1A) are formed on the switching substrate 11. In some embodiments, the material of the first conductive member 21 may include a conductive material, such as metal, metal silicide, the like, or a combination thereof, but the present disclosure is not limited thereto. For example, metal may include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto.

In some embodiments, the material of the first conductive member 21 may be formed on the switching substrate 11 by a deposition process. The deposition process may include physical vapor deposition (PVD), chemical vapor deposition (CVD), atomic layer deposition (ALD), evaporation, sputtering, any other applicable process, or a combination thereof, but the present disclosure is not limited thereto.

Then, a patterning process may be performed on the material of the first conductive member 21 to form a plurality of first conductive members 21. In some embodiments, the patterning process includes forming a mask layer (not illustrated) on the material of the first conductive member 21, and then etching the portion that is not covered by the mask layer to form a plurality of first conductive members 21.

In some embodiments, the etching process may include a dry etching process, a wet etching process, or a combination thereof. For example, the dry etching process may include reactive ion etch (ME), inductively-coupled plasma (ICP) etching, neutral beam etching (NBE), electron cyclotron resonance (ERC) etching, the like, or a combination thereof, but the present disclosure is not limited thereto. For example, the wet etching process may use, for example, hydrofluoric acid (HF), ammonium hydroxide ($NH_4OH$), or any suitable etchant.

As shown in FIG. 1A, in some embodiments, when forming the first conductive members, a plurality of first dummy conductive members 21' may be simultaneously formed, but the present disclosure is not limited thereto. In some embodiments, each first dummy conductive member 21' is adjacent to one first conductive member 21. The material and forming method of the first dummy conductive member 21' may be the same as or similar to those of the first conductive member 21, and will not be described in detail here.

Referring to FIG. 1B, a first insulating layer 31 is formed on the first conductive members 21. In the embodiment shown in FIG. 1B, the first insulating layer 31 is also formed on the first dummy conductive members 21'. In some embodiments, the material of the first insulating layer 31 may include, for example, an oxide such as silicon oxide, a nitride such as silicon nitride, any other applicable material, or a combination thereof, but the present disclosure is not limited thereto. In some embodiments, the first insulating layer 31 may be formed on the first conductive members 21 and the first dummy conductive members 21' by a deposition process. For example, the deposition process may include metal organic chemical vapor deposition (MOCVD), atomic layer deposition (ALD), molecular beam epitaxy (MBE), liquid phase epitaxy (LPE), any other applicable process, or a combination thereof, but the present disclosure is not limited thereto.

Figure 1C:
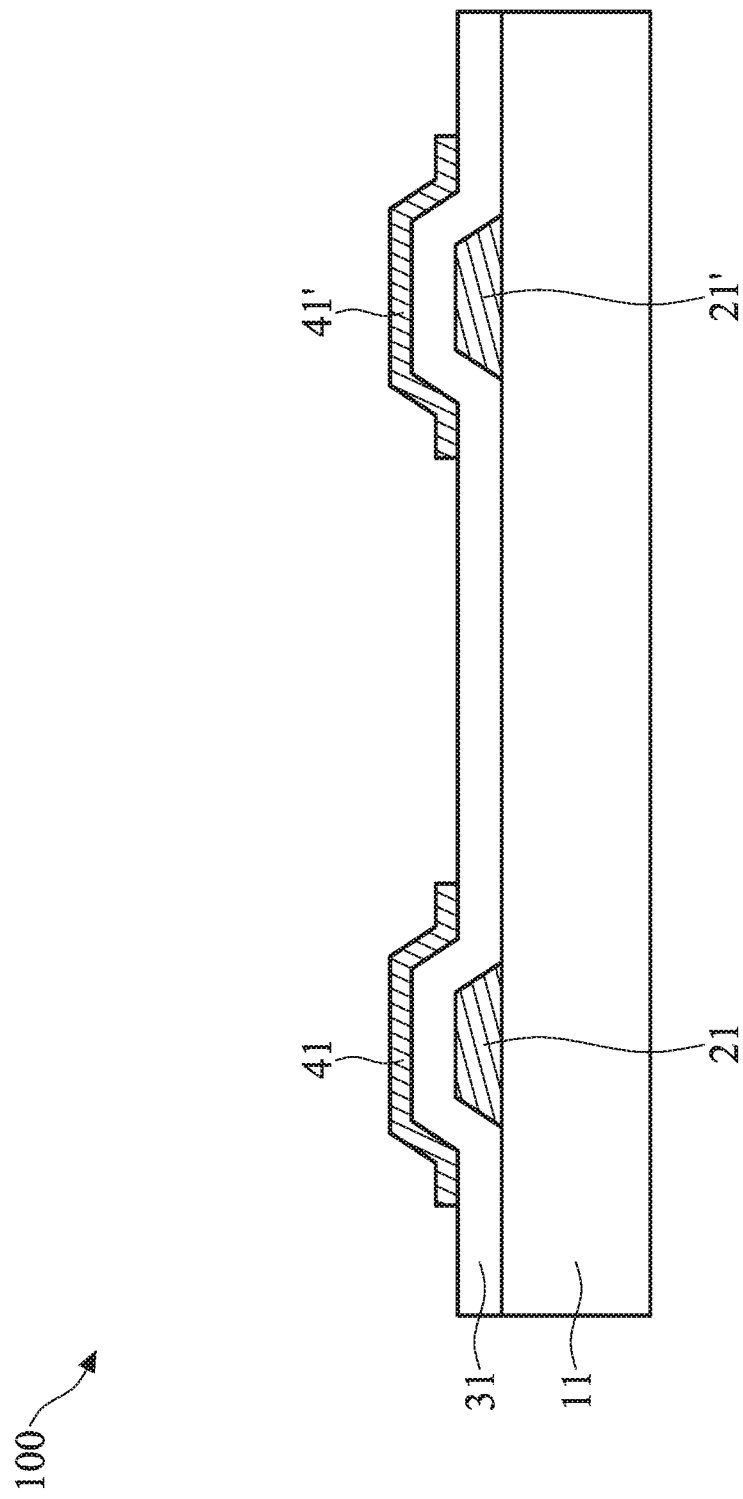

Referring to FIG. 1C, a plurality of first semiconductor layers 41 (only one first semiconductor layer 41 is shown in FIG. 1C) are formed on the first insulating layer 31. In some embodiments, the material of the first semiconductor layer 41 may include n-type or p-type doped amorphous silicon (a-Si), indium gallium zinc oxide (IGZO), organic thin film transistor (OTFT), and so on, and may be doped using a dopant, but the present disclosure is not limited thereto. In some embodiments, the first semiconductor layers 41 may be formed on the first insulating layer 31 by a deposition process. The examples of the deposition process are as described above and will not be repeated here.

As shown in FIG. 1C, in some embodiments, when forming the semiconductor layer 41, a plurality of dummy semiconductor layers 41' may be simultaneously formed on the first insulating layer 31, and each dummy semiconductor layer 41' is formed correspondingly on the first dummy conductive member 21'. The material and forming method of the dummy semiconductor layer 41' may be the same as or similar to those of the first semiconductor layer 41, and will not be described in detail here.

Figure 1D:
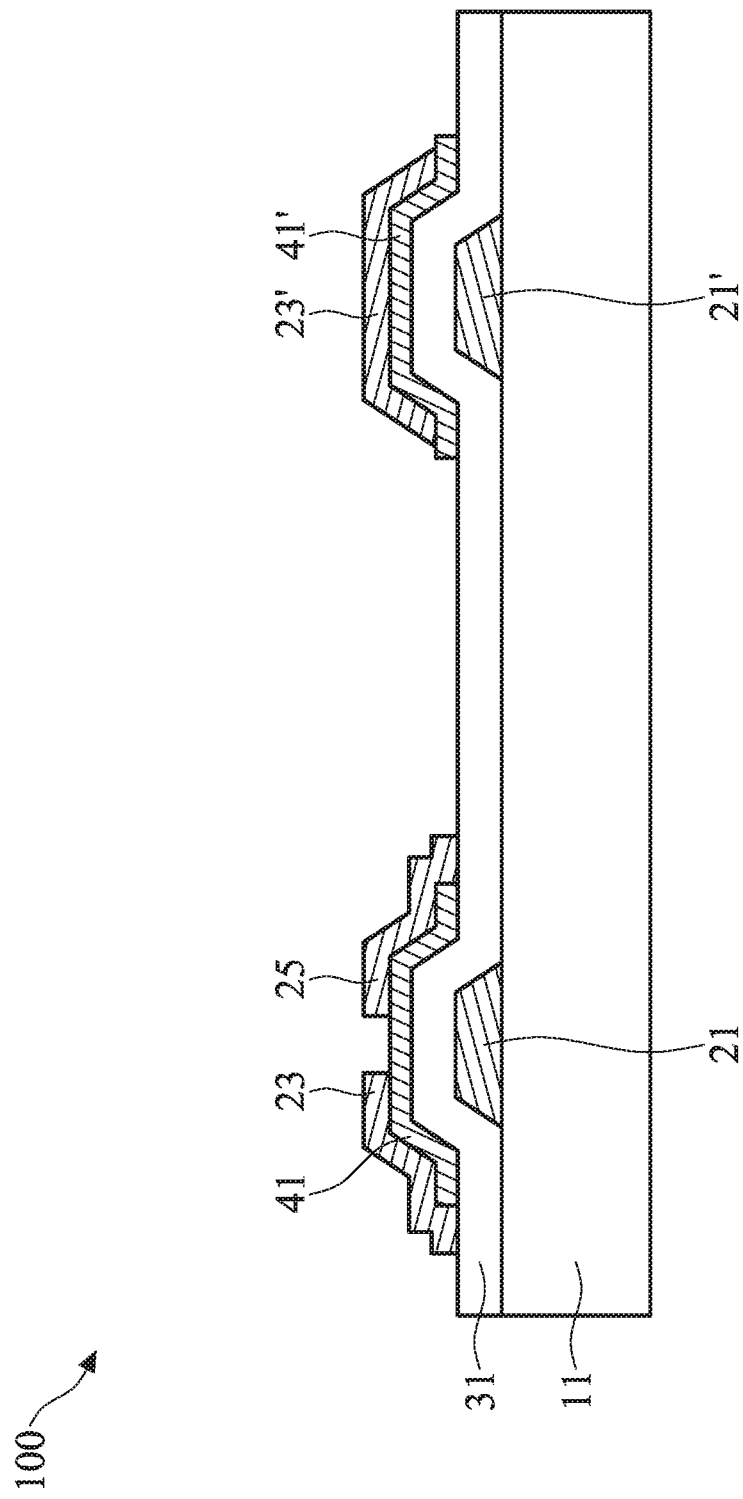

Referring to FIG. 1D, a plurality of second conductive members 23 and third conductive members 25 (only one second conductive member 23 and one third conductive member 25 are shown in FIG. 1D) are formed on the first semiconductor layers 41. In the embodiment shown in FIG. 1D, a portion of the second conductive member 23 and a portion of the third conductive member 25 may be in direct contact with the first insulating layer 31. In some embodiments, the second conductive members 23 and the third conductive members 25 may be simultaneously formed. For example, a conductive material may be formed on the first semiconductor layers 41 and the first insulating layer 31, and then a patterned process may be performed to form the second conductive members 23 and the third conductive members 25, but the present disclosure is not limited thereto. In some embodiments, the material and forming method of the second conductive member 23 and the third conductive member 25 may be the same as or similar to those of the first conductive member 21, and will not be described in detail here. Moreover, the second conductive member 23 and the third conductive member 25 are separated from each other (electrically isolated from each other).

As shown in FIG. 1D, in some embodiments, when forming the second conductive members 23 and the third conductive members 25, a plurality of second dummy conductive members 23' may be simultaneously formed on the dummy semiconductor members 41'. The material and forming method of the second dummy conductive member 23' may be the same as or similar to those of the second conductive member 23 (or the third conductive member 25), and will not be described in detail here.

Figure 1E:
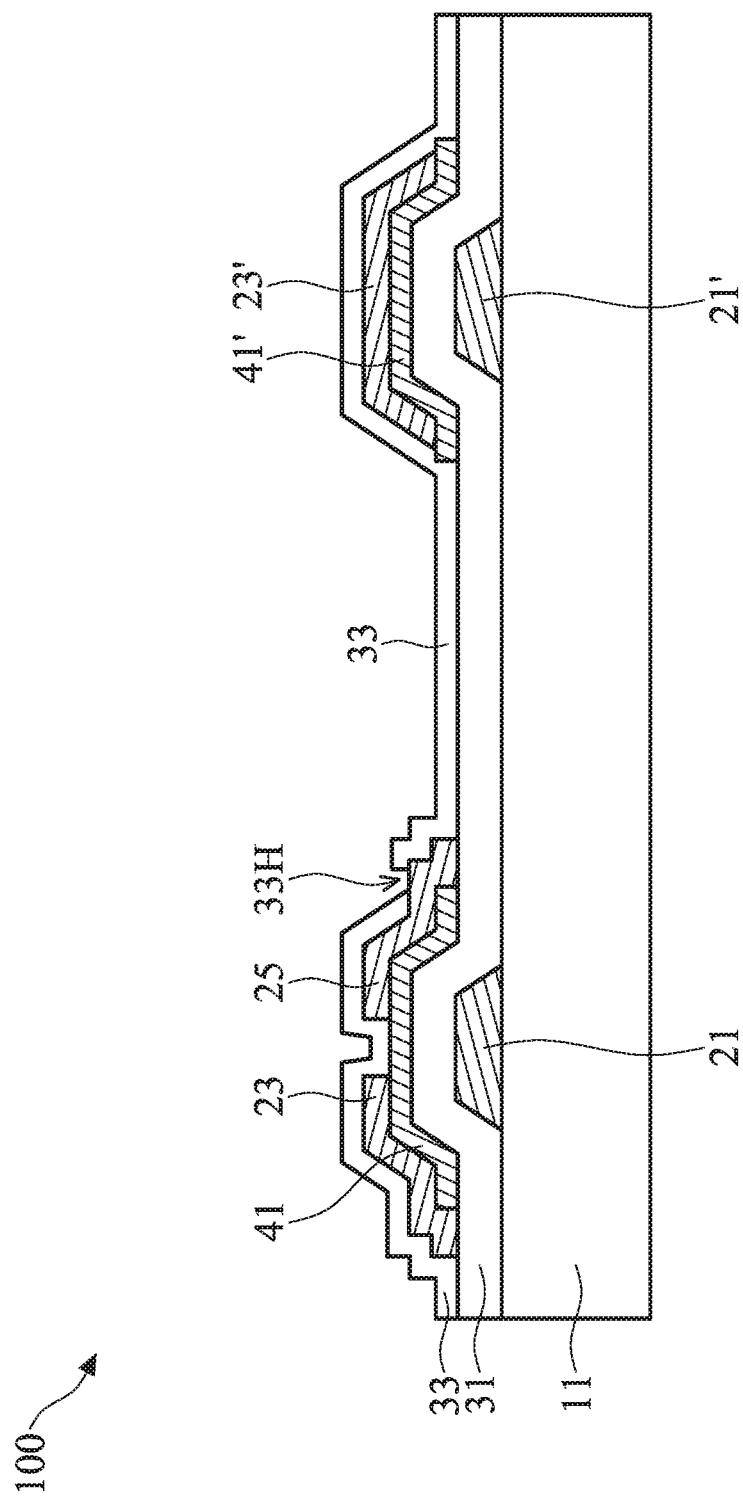

Referring to FIG. 1E, a second insulating layer 33 is formed on the second conductive members 23 and the third conductive members 25. In the embodiment shown in FIG. 1E, the second insulating layer 33 is also formed on the second dummy conductive members 23'. In some embodiments, the material and forming method of the second insulating layer 33 may be the same as or similar to those of the first insulating layer 31, and will not be described in detail here.

As shown in FIG. 1E, the second insulating layer 33 may have a through hole 33H that exposes at least a portion of the surface of the third conductive member 25, but the present disclosures is not limited thereto. In some other embodiments, the through hole 33H may expose at least a portion of the surface of the second conductive member 23.

Figure 1F:
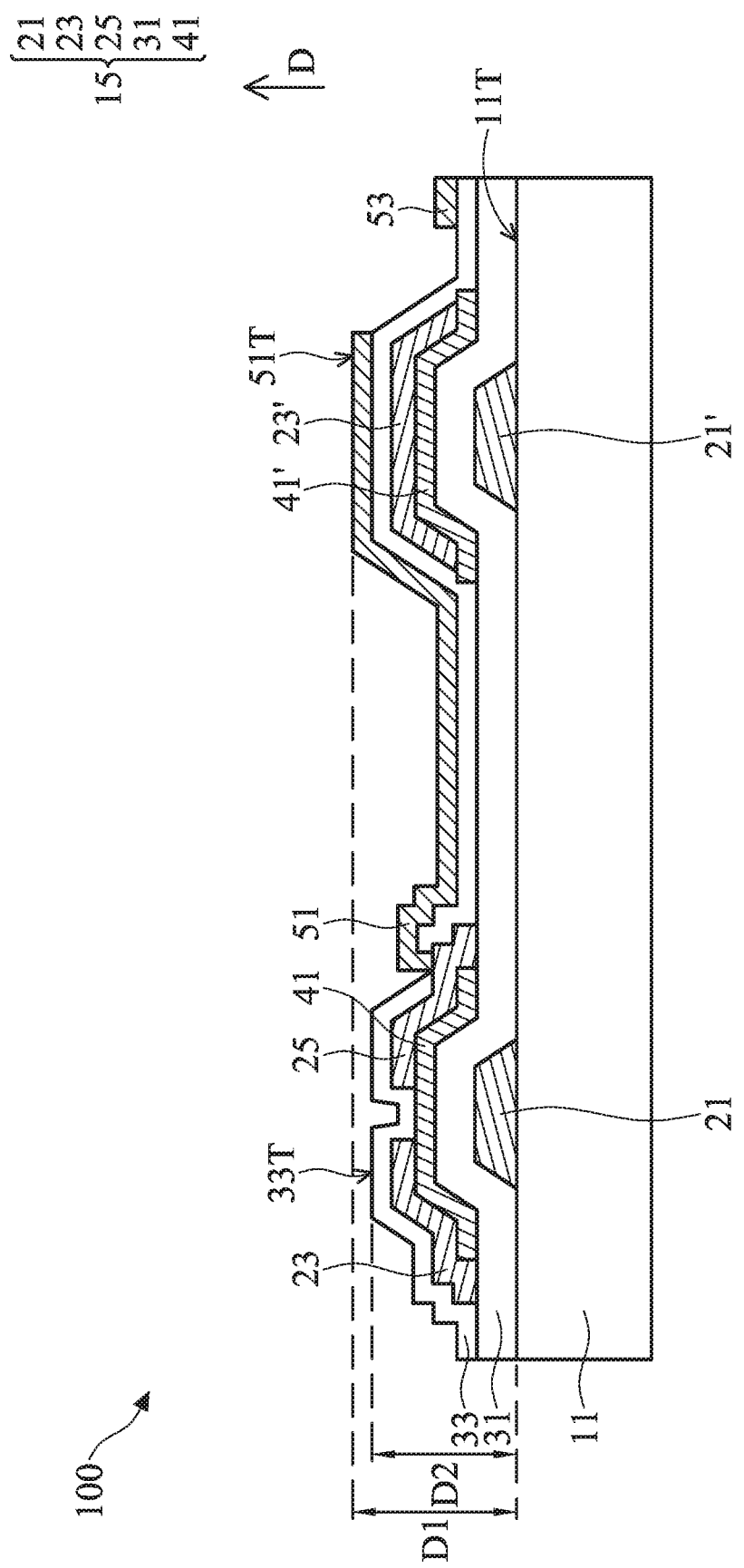

Referring to FIG. 1F, a plurality of connecting members 51 (only one connecting member 51 is shown in FIG. 1F) are formed on the second insulating layer 33. In some embodiments, the material of the connecting member 51 may include metal. For example, metal may include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto. In some embodiments, the connecting members 51 may be formed by physical vapor deposition (PVD), chemical vapor deposition (CVD), atomic layer deposition (ALD), evaporation, sputtering, any other applicable process, or a combination thereof, but the present disclosure is not limited thereto.

In the embodiments of the present disclosure, each connecting member 51 may be electrically connected to one of the second conductive member 23 and the third conductive member 25. As shown in FIG. 1F, the connecting member 51 may be in direct contact with the third conductive member 25 through the through hole 33H of the second insulating layer 33, so that the connecting member 51 may be electrically connected to the third conductive member 25, but the present disclosure is not limited thereto. In some other embodiments, the connecting member 51 may be in direct contact with the second conductive member 23, so that the connecting member 51 may be electrically connected to the second conductive member 23.

As shown in FIG. 1F, in some embodiments, the first conductive members 21, the first insulating layer 31, the first semiconductor layers 41, the second conductive members 23, and the third conductive members 25 may define a plurality of switching elements 15. That is, in some embodiments, the switching structure 100 may include a plurality of switching elements 15. Moreover, the first conductive member 21 may be, for example, the gate electrode of the switching structure 100, and the second conductive member 23 and the third conductive member 25 may be, for example, the source electrode/drain electrodes of the switching structure 100.

As shown in FIG. 1F, in some embodiments, at least one grounding member 53 may be formed on the second insulating layer 33. For example, the material and forming method of the grounding member 53 may be the same as or similar to those of the connecting member 51. In addition, the grounding member 53 is electrically connected to the switching elements 15. It should be noted that the number of grounding members 53 is not limited in the embodiments of the present disclosure. For example, in some embodiments, the number of ground members 53 is the same as the number of switching elements 15. That is, the switching elements 15 are electrically connected to the corresponding ground members 53, respectively, but the present disclosure is not limited thereto. In some other embodiments, the number of ground member 53 may also be one. That is, all switching elements 15 may be electrically connected to a common ground member 53.

In the embodiment shown in FIG. 1F, since the connecting member 51 is stacked on the first dummy conductive member 21', the first insulating layer 31, the second dummy conductive member 23', the second insulating layer 33, and the dummy semiconductor layers 41', the top surface 51T of the connecting member 51 may be higher than the top surface 33T of the second insulating layer 33. Here, the top surface 51T of the connecting member 51 is the topmost surface of the connecting member 51 in the normal direction of the switching structure 100, and the top surface 33T of the second insulating layer 33 is the topmost surface of the second insulating layer 33 in the normal direction of the switching structure 100. In other words, the distance D1 between the top surface 51T of the connecting member 51 and the top surface 11T of the switching substrate 11 is greater than the distance D2 between the top surface 33T of the second insulating layer 33 and the top surface 11T of the switching substrate 11.

However, the present disclosure is not limited thereto. In some other embodiments, the switching structure 100 may exclude the first dummy conductive member 21', the second dummy conductive member 23', and the dummy semiconductor layer 41'. In these embodiments, the top surface 51T of the connecting member 51 may be higher than the top surface 33T of the second insulating layer 33 by adjusting the thickness of the first insulating layer 31 or the thickness of the second insulating layer 33, or changing the thickness of the connecting member 51 to be variable (not constant).

In other words, the switching structure 100 according to the embodiment of the present disclosure includes a switching substrate 11. The switching structure 100 also includes a plurality of first conductive members 21 disposed on the switching substrate 11. The switching structure 100 further includes a first insulating layer 31 disposed on the first conductive members 21. The switching structure 100 includes a plurality of first semiconductor layers 41 disposed on the first insulating layer 31. The switching structure 100 also includes a plurality of second conductive members 23 and third conductive members 25 disposed on the first semiconductor layers 41. The switching structure 100 further includes a second insulating layer 33 disposed on the second conductive members 23 and the third conductive members 25. Moreover, the switching structure 100 includes a plurality of connecting members 51 disposed on the second insulating layer 33. Each of the connecting members 51 is electrically connected to one of the second conductive members 23 or one of the third conductive members 25, and the top surface 51T of each of the connecting members 51 is higher than the top surface 33T of the second insulating layer 33.

FIGS. 2A-2E are cross-sectional views illustrating various stages of manufacturing the light-emitting structure 200 according to one embodiment of the present disclosure. It should be noted that some components may be omitted in FIGS. 2A-2E in order to more clearly show the technical features of the embodiments of the present disclosure.

Figure 2A:
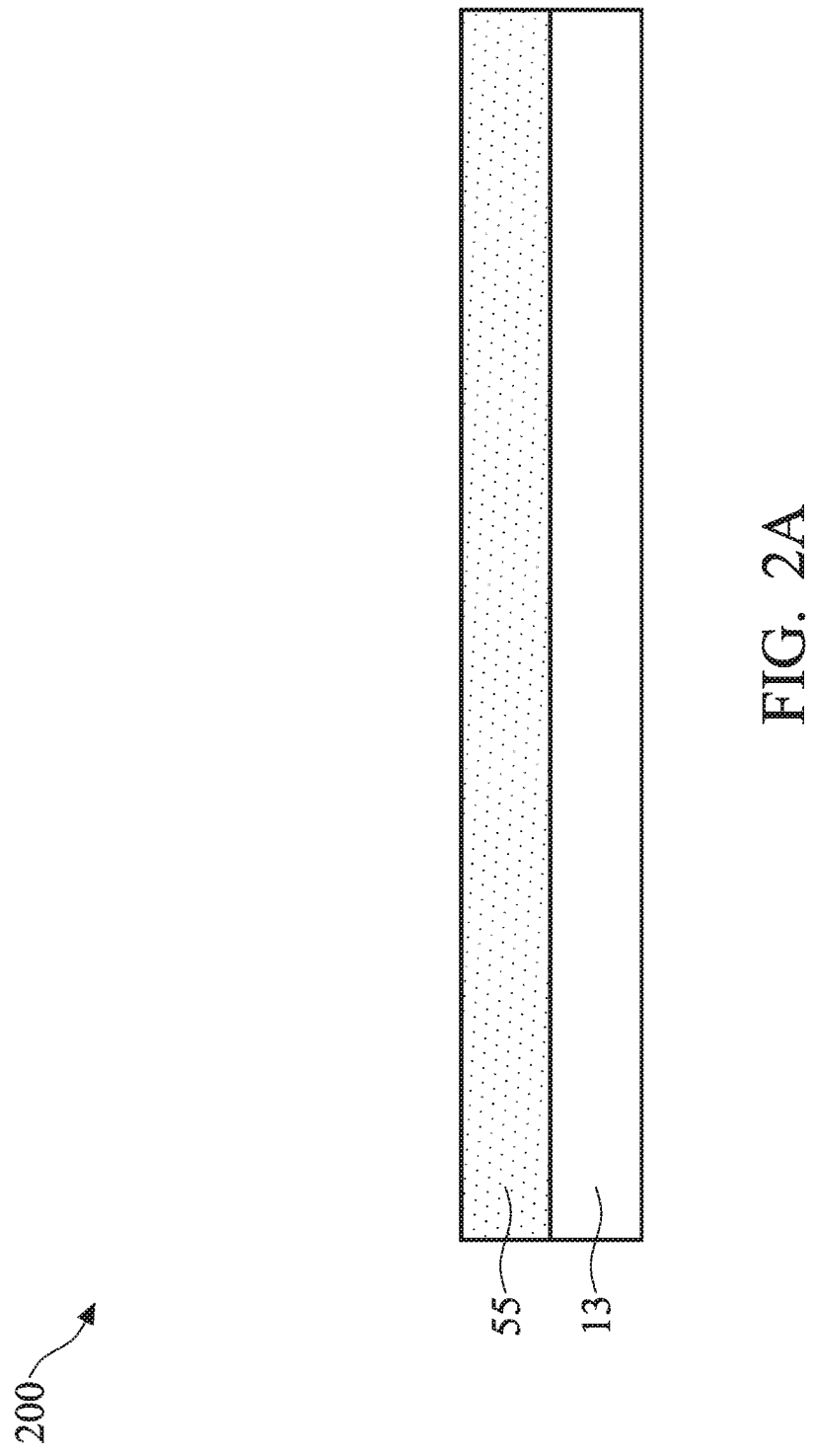
FIGS. 2A-2E are cross-sectional views illustrating various stages of manufacturing the light-emitting structure according to one embodiment of the present disclosure.

Referring to FIG. 2A, a carrier substrate 13 is provided. In some embodiments, the carrier substrate 13 may be a bulk semiconductor substrate or include a composite substrate formed of different materials, and the carrier substrate 13 may be doped (for example, using p-type or n-type dopants) or undoped. In some embodiments, the carrier substrate 13 may include a semiconductor substrate, a glass substrate, or a ceramic substrate, such as a silicon substrate, a silicon germanium substrate, a silicon carbide, an aluminum nitride substrate, a sapphire substrate, any other applicable substrate, or a combination thereof, but the present disclosure is not limited thereto. In some embodiments, the carrier substrate 13 may include a semiconductor-on-insulator (SOI) substrate formed by disposing a semiconductor material on an insulating layer.

Referring to FIG. 2A, a common conductive layer 55 is formed on the carrier substrate. In some embodiments, the material of the common conductive layer 55 may include metal. For example, metal may include gold (Au), nickel (Ni), platinum (Pt), palladium (Pd), iridium (Ir), titanium (Ti), chromium (Cr), tungsten (W), aluminum (Al), copper (Cu), any other applicable metal, an alloy thereof, or a combination thereof, but the present disclosure is not limited thereto. In some embodiments, the common conductive layer 55 may be formed by physical vapor deposition (PVD), chemical vapor deposition (CVD), atomic layer deposition (ALD), evaporation, sputtering, any other applicable process, or a combination thereof, but the present disclosure is not limited thereto.

Figure 2B:
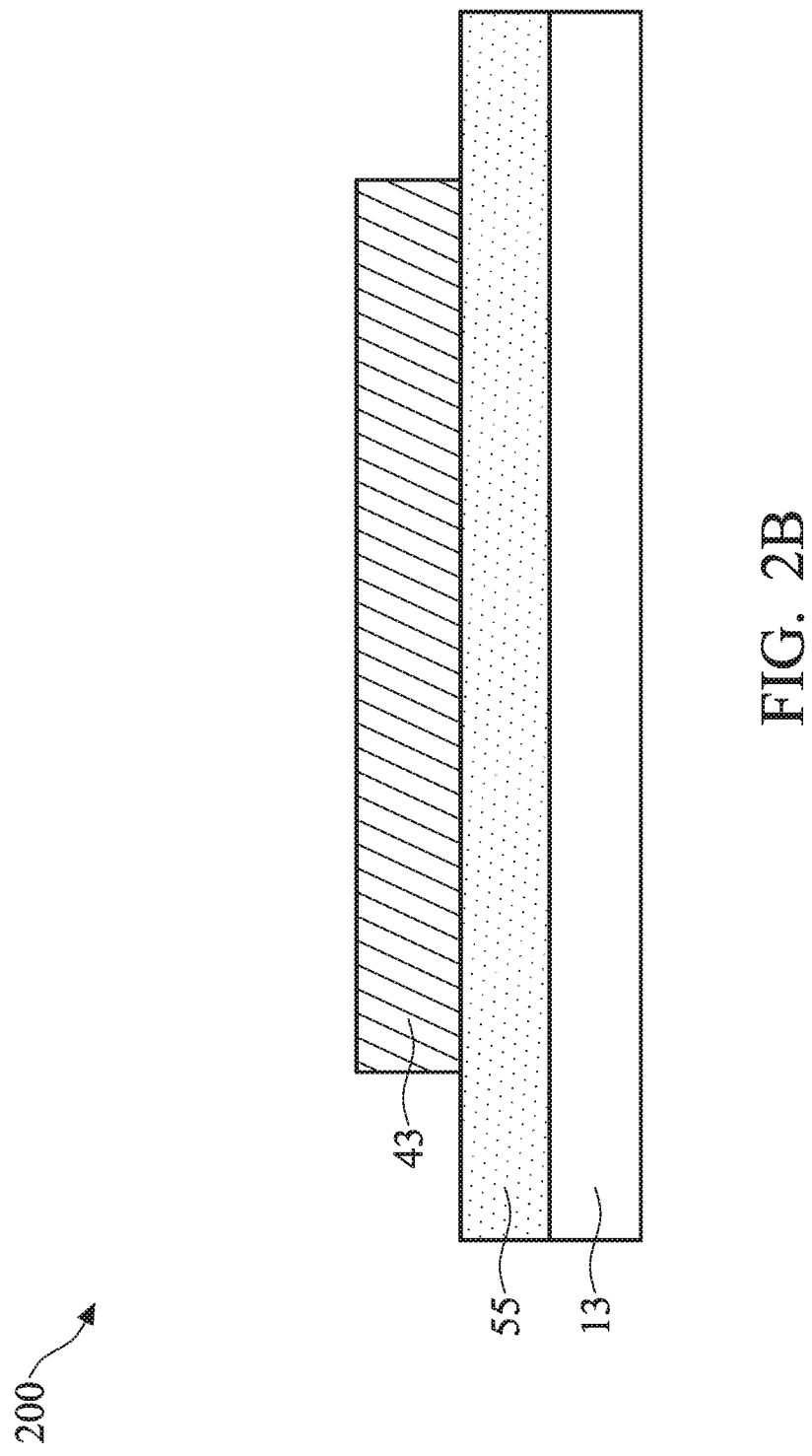

Referring to FIG. 2B, a plurality of second semiconductor layers 43 (only one second semiconductor layer 43 is shown in FIG. 2B) are formed on the common conductive layer 55. That is, the common conductive layer 55 may be formed between the carrier substrate 13 and the second semiconductor layers 43, but the present disclosure is not limited thereto. In some other embodiments, a plurality of second semiconductor layers 43 may be directly formed on the carrier substrate 13 without the common conductive layer 55. In some embodiments, the material and forming method of the second semiconductor layer 43 may be the same as or similar to those of the first semiconductor layer 41, and will not be described in detail here.

Figure 2C:
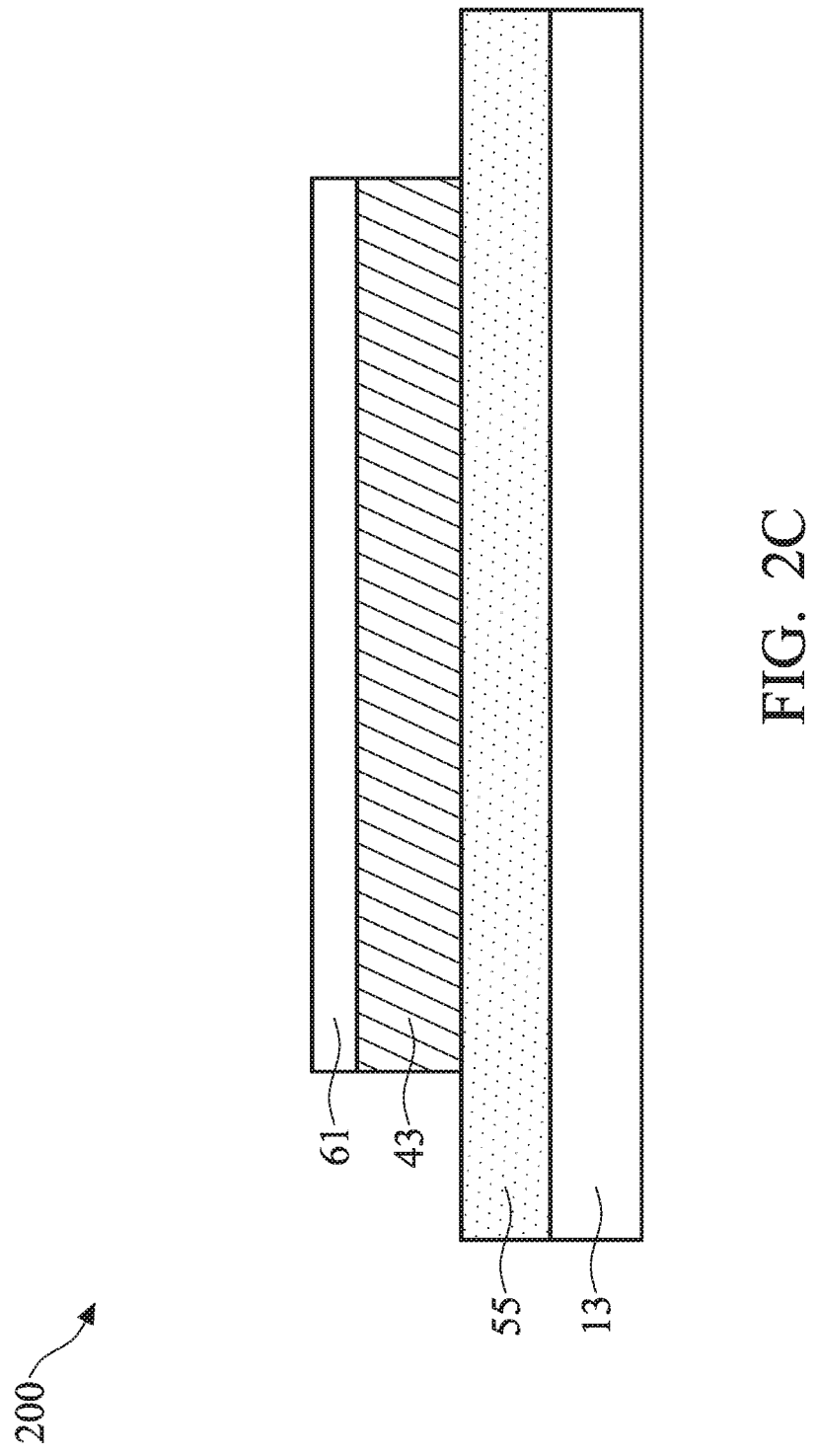

Referring to FIG. 2C, a plurality of active layers 61 (only one active layer 61 is shown in FIG. 2C) are formed on the second semiconductor layers 43. In some embodiments, the material of the active layer 61 may include gallium antimonide (GaSb), gallium arsenide (GaAs), indium phosphide (InP), silicon-germanium (SiGe), gallium nitride (GaN), any other applicable material, or a combination thereof, but the present disclosure is not limited thereto. For example, when the light-emitting structure 200 is to emit red light, the material of the active layer 61 may further include aluminum gallium indium phosphide (InGaALP); when the light-emitting structure 200 is to emit green/blue light, the material of the active layer 61 may further include indium gallium nitride (InGaN). Moreover, the active layers 61 may be formed on the second semiconductor layers 43 by a deposition process. The examples of the deposition process are as described above and will not be repeated here.

Figure 2D:
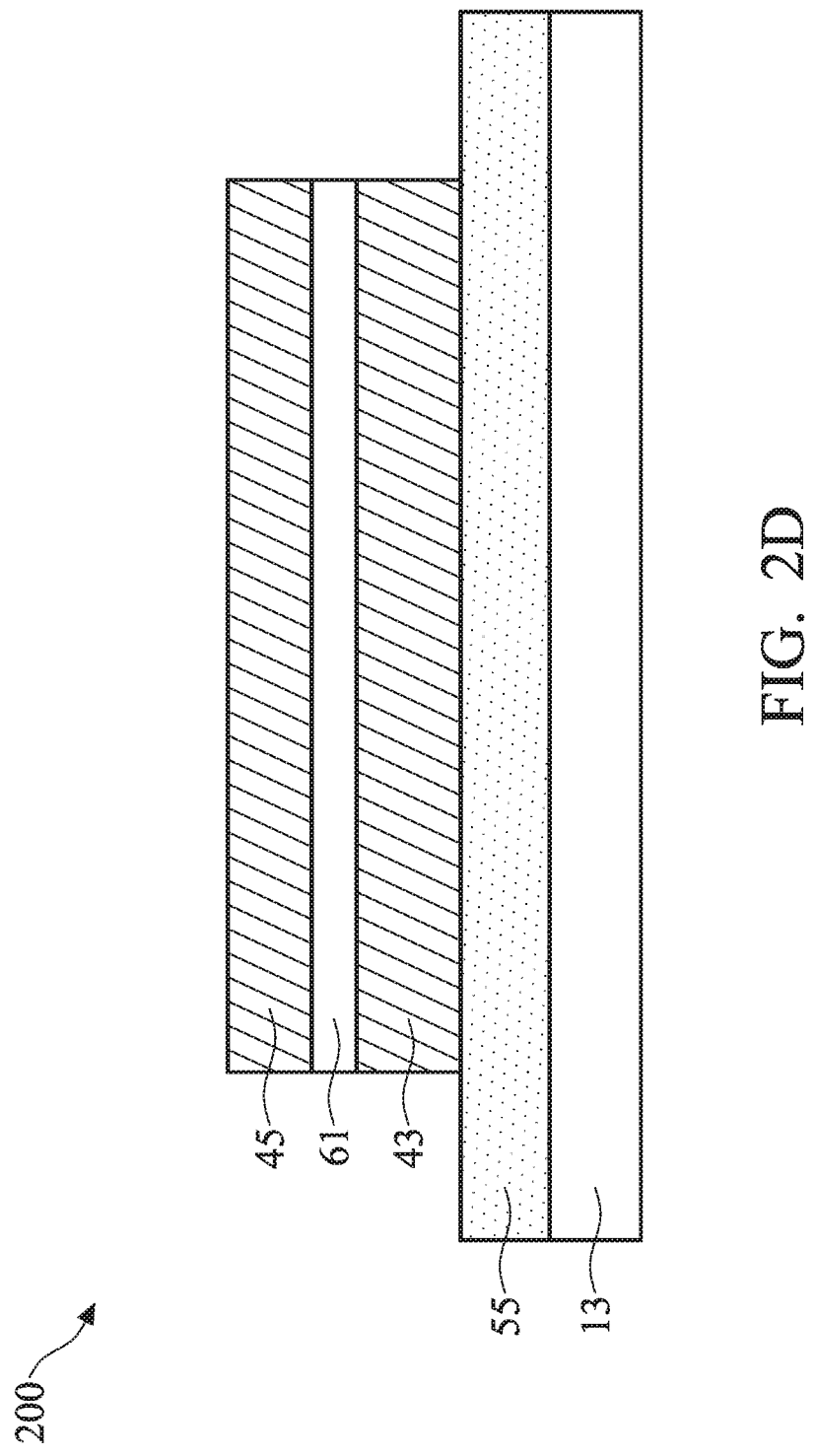

Referring to FIG. 2D, a plurality of third semiconductor layers 45 (only one third semiconductor layer 45 is shown in FIG. 2D) are formed on the active layers 61. In some embodiments, the material and forming method of the third semiconductor layer 45 may be the same as or similar to those of the first semiconductor layer 41 or the second semiconductor layer 43, but the conductivity type of the third semiconductor layer 45 is different from the conductivity type of the second semiconductor layer 43, which will not be described in detail here.

Figure 2E:
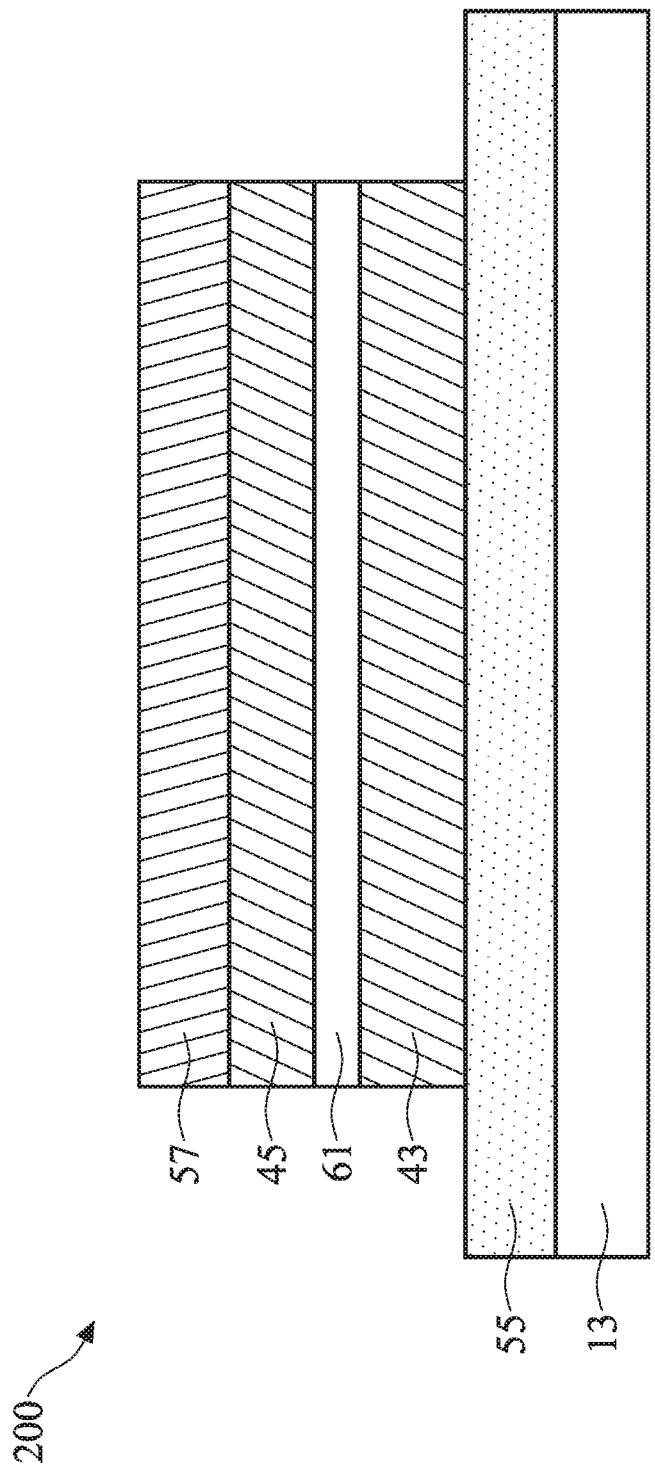

Referring to FIG. 2E, a plurality of fourth conductive members 57 (only one fourth conductive member 57 is shown in FIG. 2E) are formed on the third semiconductor layers 45 to form the light-emitting structure 200. In some embodiments, the material and forming method of the fourth conductive member 57 may be the same as or similar to those of the connecting member 51, and will not be described in detail here.

As shown in FIG. 2E, in some embodiments, the second semiconductor layers 43, the active layers 61, the third semiconductor layers 45, and the fourth conductive members 57 may define a plurality of light-emitting elements 17. That is, the light-emitting structure 200 may include a plurality of light-emitting elements 17.

In other words, the light-emitting structure 200 according to the embodiment of the present disclosure includes a carrier substrate 13. The light-emitting structure 200 also includes a plurality of second semiconductor layers 43 disposed on the carrier substrate 13. The light-emitting structure 200 further includes a plurality of active layers 61 disposed on the second semiconductor layers 43. The light-emitting structure 200 includes a plurality of third semiconductor layers 45 disposed on the active layers 61. The light-emitting structure 200 also includes a plurality of fourth conductive members 57 disposed on the third semiconductor layers 45.

Figure 3A:
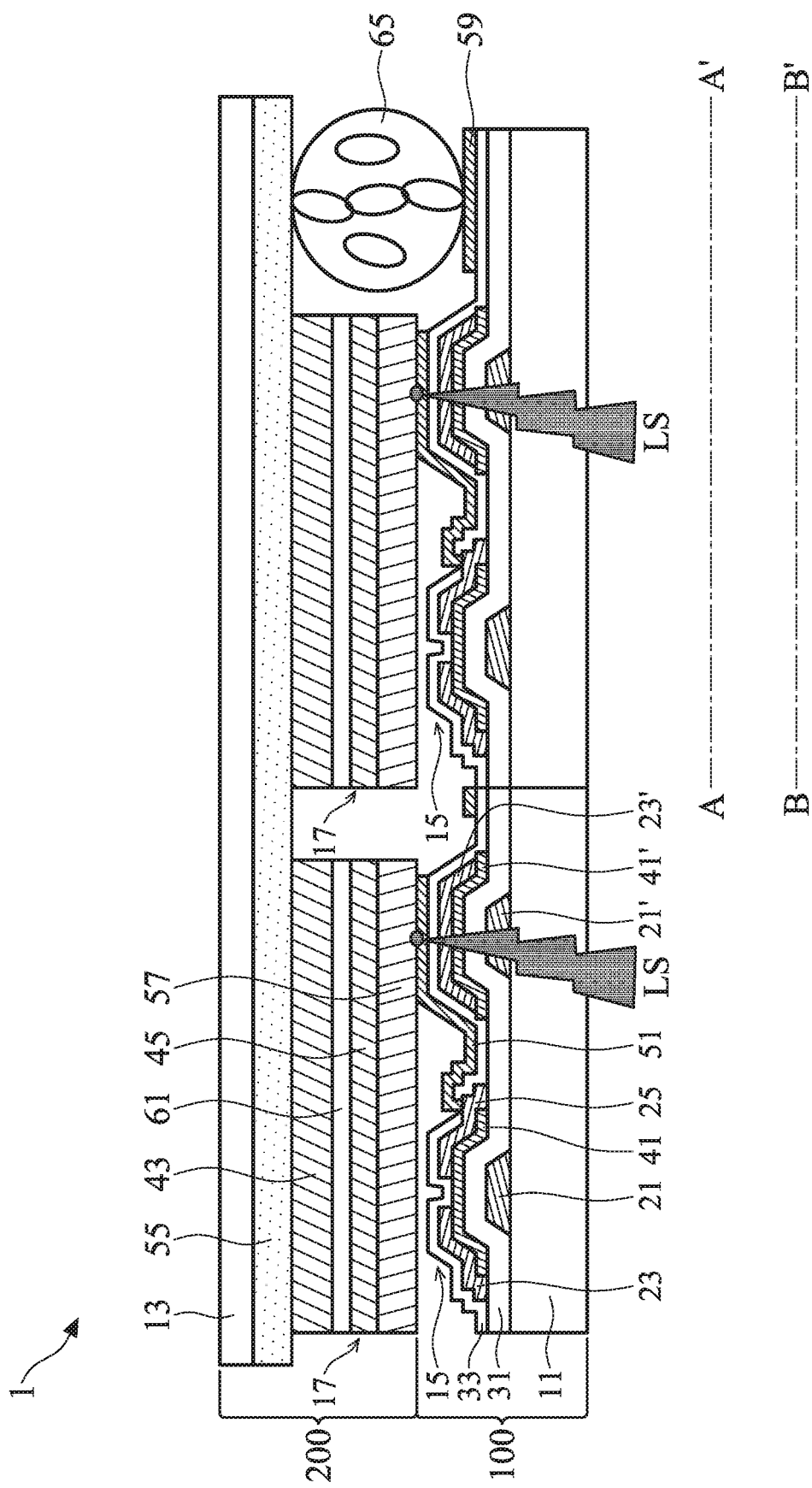
FIG. 3A is a cross-sectional view illustrating a display device according to one embodiment of the present disclosure.
Figure 3B:
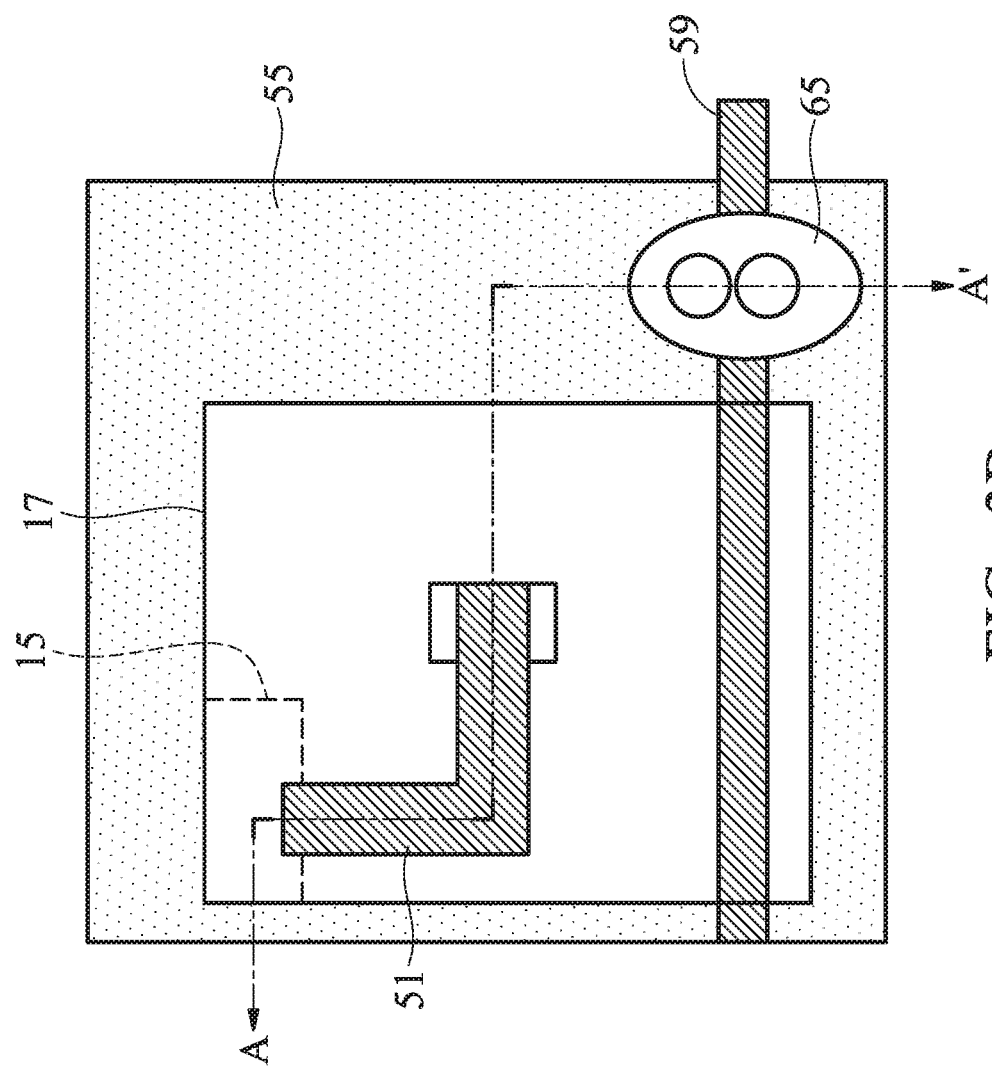
FIG. 3B is an example of a partial top view of the display device.
Figure 3C:
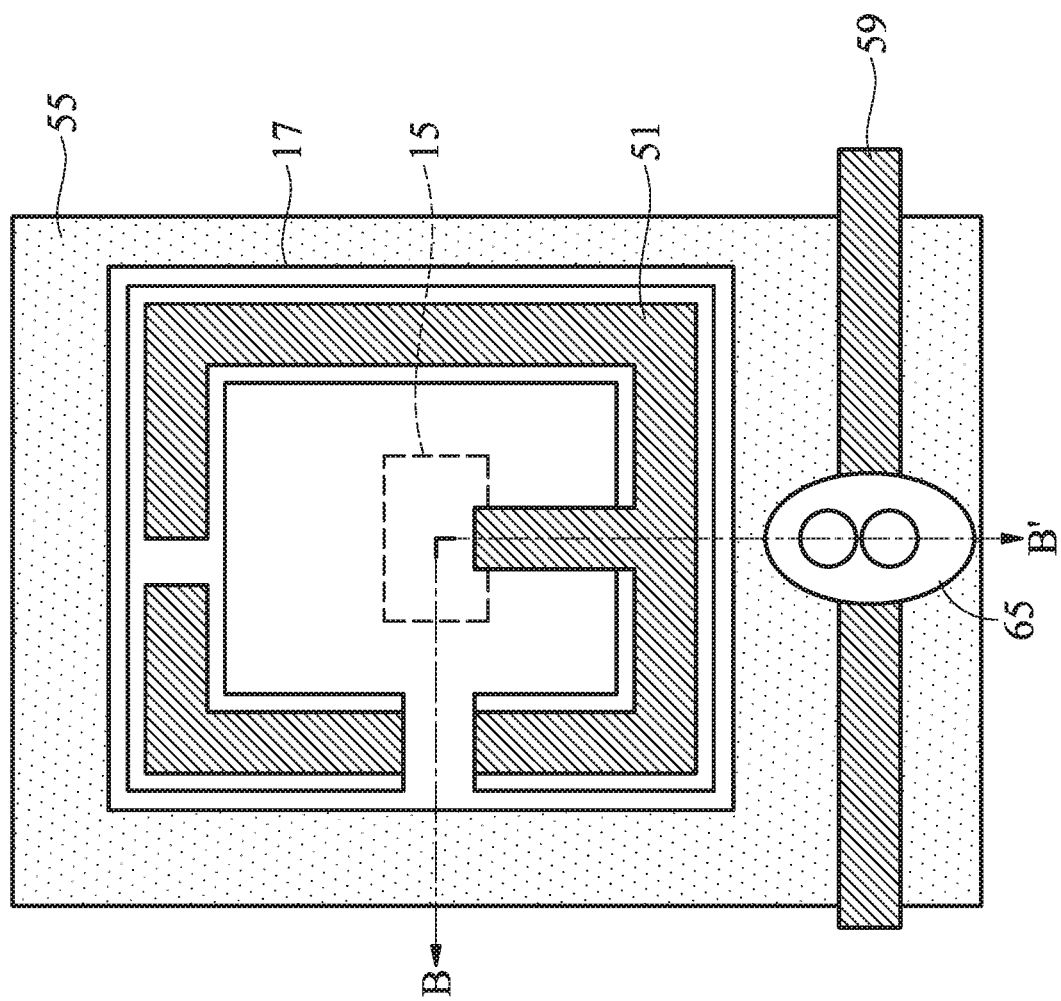
FIG. 3C is another example of a partial top view of the display device.

FIG. 3A is a cross-sectional view illustrating a display device 1 according to one embodiment of the present disclosure. FIG. 3B is an example of a partial top view of the display device 1. FIG. 3C is another example of a partial top view of the display device 1. Similarly, some components may be omitted in FIGS. 3A-3C in order to more clearly show the technical features of the embodiments of the present disclosure.

Referring to FIG. 3A, the light-emitting structure 200 shown in FIG. 2E is arranged on the switching structure 100 shown in FIG. 1F, so that each light-emitting element 17 is above one switching element 15. Then, each light-emitting element 17 is connected to the corresponding switching element 15 via a laser LS to form the display device 1. In particular, each fourth conductive member 57 may be connected to one connecting element 15 via the laser LS as shown in FIG. 3A.

In other words, the display device 1 according to the embodiment of the present disclosure includes a switching structure 100 that includes a plurality of switching elements 15. The display device 1 also includes a light-emitting structure 200 disposed on the switching structure 100, and the light-emitting structure 200 includes a plurality of light-emitting elements 17. Each of the light-emitting elements 17 is disposed correspondingly on one of the switching elements 15, and each of the light-emitting elements 17 is connected to the corresponding switching element 15. That is, the light-emitting elements 17 (e.g., micro LED chips) of the light-emitting structure 200 may be stacked on the corresponding switching elements 15 (e.g., thin film transistor (TFT)) in the switching structure 100.

In this embodiment, a portion of the display device 1 shown in FIG. 3A may be, for example, a cross-sectional view of the display device 1 along line A-A' in FIG. 3B or along line B-B' in FIG. 3C, but the present disclosure is not limited thereto. In some other embodiments, the top view of the display device 1 may be different from FIG. 3B or FIG. 3C, and may be designed according to actual needs.

Since the top surface 51T of the connecting member 51 may be higher than the top surface 33T of the second insulating layer 33 of the switching structure 100 according to the embodiments of the present disclosure, the light-emitting elements 17 (e.g., micro LED chips) of the light-emitting structure 200 may be stacked on the corresponding switching elements 15 (e.g., thin film transistor (TFT)) in the switching structure 100, and each light-emitting element 17 may be connected to the corresponding switching element 15 via a laser LS. Therefore, the size of a single pixel may be effectively reduced to achieve high resolution.

Moreover, since each light-emitting element 17 is connected to the corresponding switching element 15 via a laser in the manufacturing method of the display device according to the embodiments of the present disclosure, it does not require a complicated process or use more photomasks. As a result, the display device 1 with high resolution may be completed at a lower manufacturing cost.

As shown in FIG. 3A, in some embodiments, the switching structure 100 may include a common grounding member 59 that may be formed on the second insulating layer 33 and electrically connected to all switching elements 15. Moreover, in the embodiment shown in FIG. 3A, the display device 1 may further include a common conductive structure 65 that is disposed between the switching structure 100 and the light-emitting structure 200 and in direct contact with the common grounding member 59 of the switching structure 100 and the common conductive layer 55 of the light-emitting structure 200. In some embodiments, the common conductive structure 65 may be, for example, a conductive ball, but the present disclosure is not limited thereto.

Figure 4:
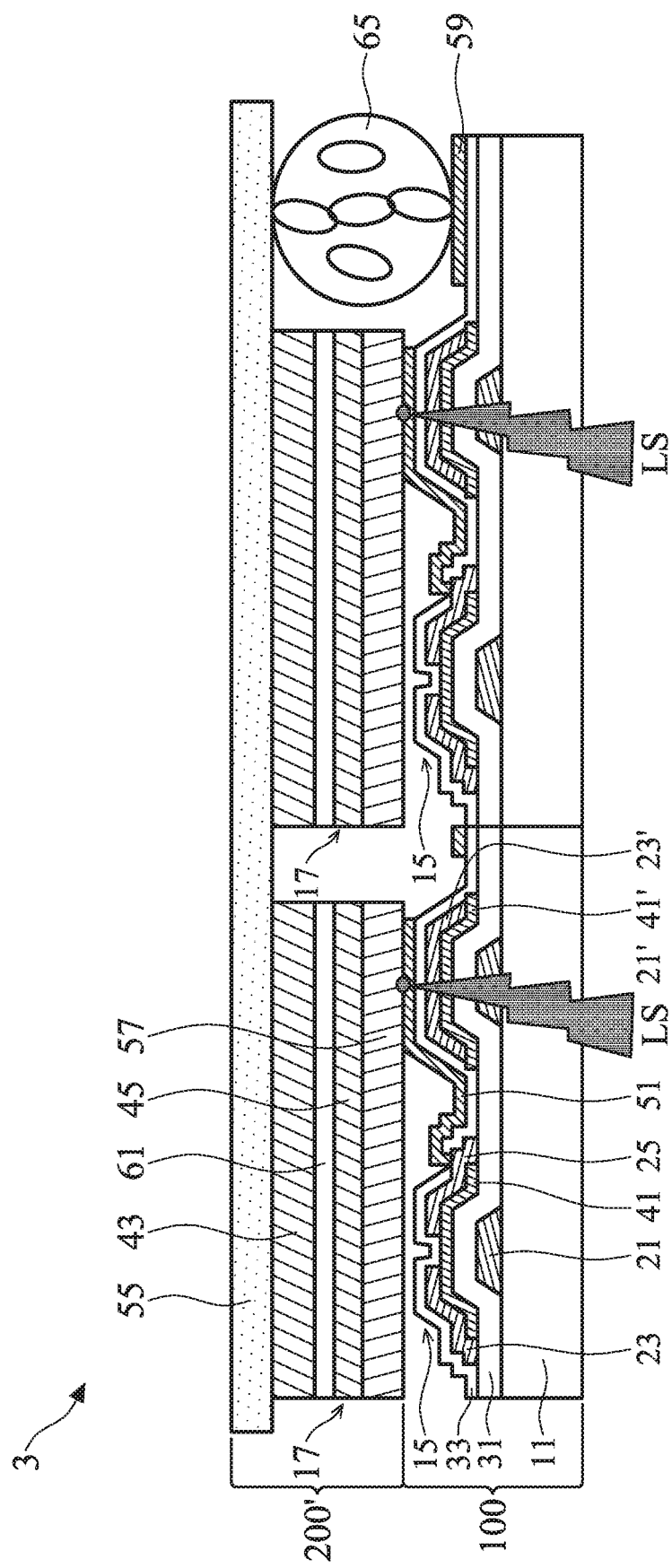
FIG. 4 is a cross-sectional view illustrating a display device according to another embodiment of the present disclosure.

FIG. 4 is a cross-sectional view illustrating a display device 3 according to another embodiment of the present disclosure. Similarly, some components may be omitted in FIG. 4 in order to more clearly show the technical features of the embodiments of the present disclosure. Moreover, a portion of the display device 3 shown in FIG. 4 may be, for example, a cross-sectional view along line A-A' in FIG. 3B or along line B-B' in FIG. 3C, but the present disclosure is not limited thereto.

The display device 3 shown in FIG. 4 has a similar structure to the display device 1 shown in FIG. 3A. The difference from the display device 1 shown in FIG. 3A is that the light-emitting structure 200' of the display device 3 shown in FIG. 4 does not include the carrier substrate 13. In other words, the plurality of light-emitting elements 17 may be directly formed on the common conductive layer 55.

Figure 5:
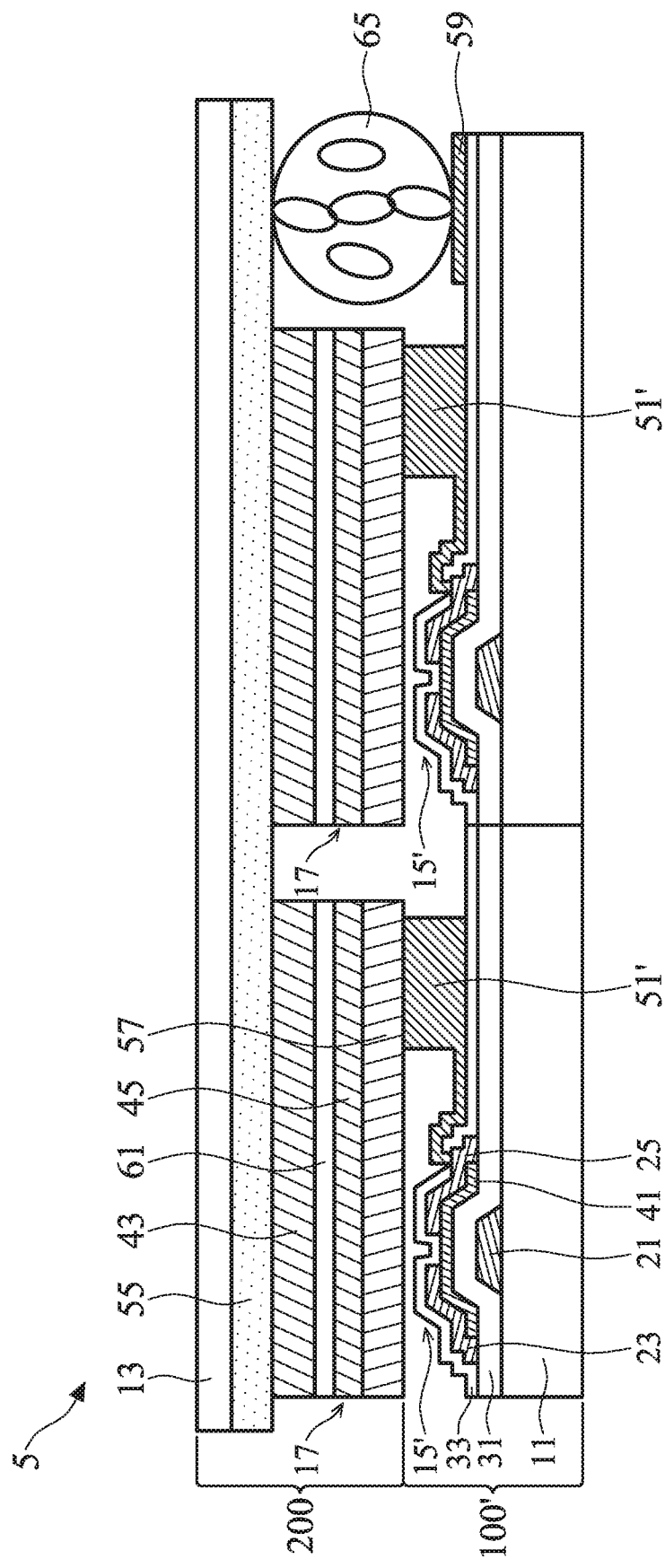
FIG. 5 is a cross-sectional view illustrating a display device according to another embodiment of the present disclosure.

FIG. 5 is a cross-sectional view illustrating a display device 5 according to another embodiment of the present disclosure. Similarly, some components may be omitted in FIG. 5 in order to more clearly show the technical features of the embodiments of the present disclosure. Moreover, a portion of the display device 5 shown in FIG. 5 may be, for example, a cross-sectional view along line A-A' in FIG. 3B or along line B-B' in FIG. 3C, but the present disclosure is not limited thereto.

The display device 5 shown in FIG. 5 has a similar structure to the display device 1 shown in FIG. 3A. The difference from the display device 1 shown in FIG. 3A is that the switching structure 100' of the display device 5 shown in FIG. 5 does not include the first dummy conductive member 21', the second dummy conductive member 23', and the dummy semiconductor layers 41'. In this embodiment, the thickness of the connecting member 51' of the switching structure 100' is variable (not constant), so that the top surface of the connecting member 51' may be higher than the top surface of the second insulating layer 33, but the present disclosure is not limited thereto. In some other embodiments, the top surface of the connecting member 51' may be higher than the top surface of the second insulating layer 33 by adjusting the thickness of the first insulating layer 31 or the thickness of the second insulating layer 33.

Figure 6:
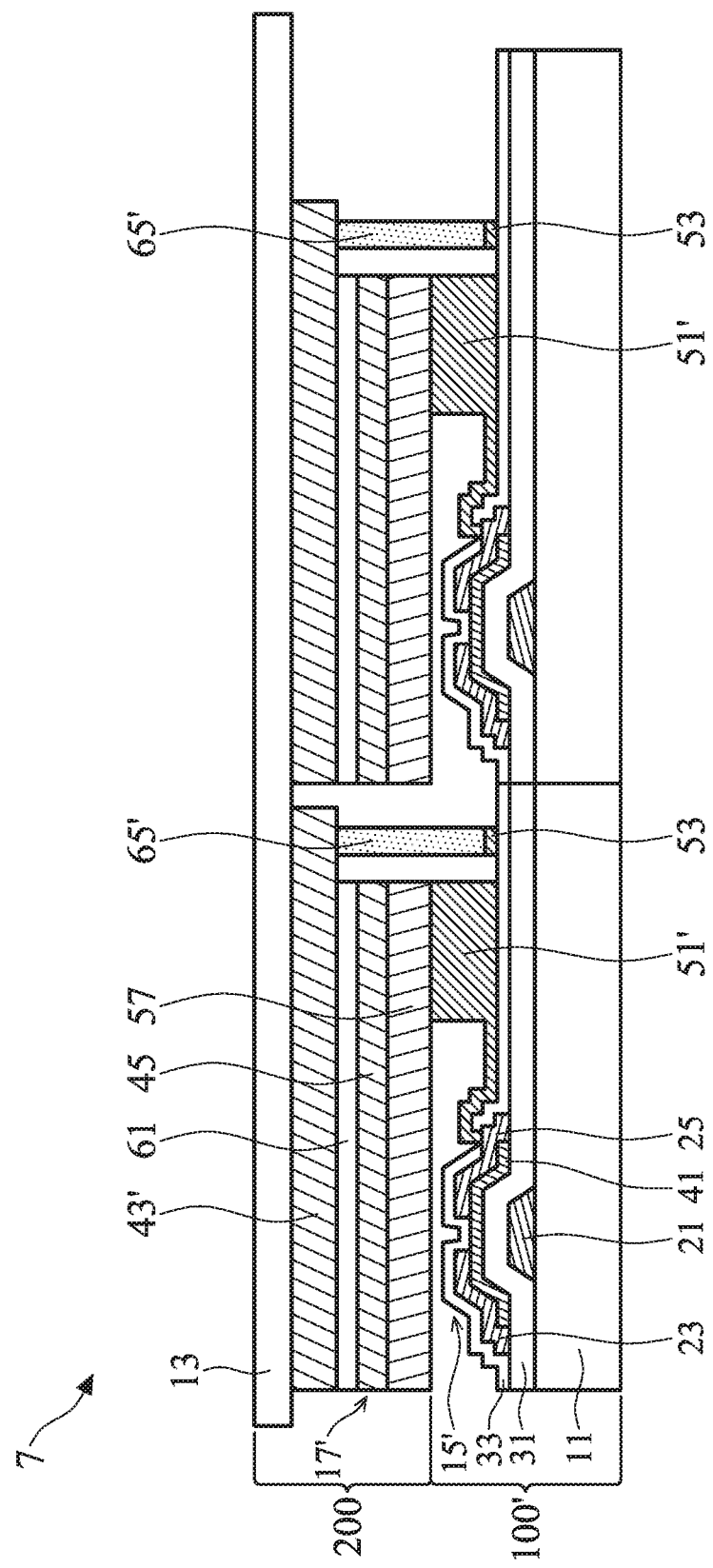
FIG. 6 is a cross-sectional view illustrating a display device according to another embodiment of the present disclosure.

In the foregoing embodiments, the second semiconductor layer 43 is aligned with the active layer 61, the third semiconductor layer 45, and the fourth conductive member 57 disposed on the second semiconductor layer 43, but the present disclosure is not limited thereto. FIG. 6 is a cross-sectional view illustrating a display device 7 according to another embodiment of the present disclosure. Similarly, some components may be omitted in FIG. 6 in order to more clearly show the technical features of the embodiments of the present disclosure.

The display device 7 shown in FIG. 6 has a similar structure to the display device 5 shown in FIG. 5. The difference from the display device 5 shown in FIG. 5 is that the light-emitting structure 200 of the display device 7 shown in FIG. 6 does not include the common conductive layer 55, and the width of the second semiconductor layer 43' is greater than the widths of the active layer 61, the third semiconductor layer 45, and the fourth conductive member 57 disposed on the second semiconductor layer 43'. That is, at least a portion of the second semiconductor layer 43' exceeds the active layer 61, the third semiconductor layer 45, and the fourth conductive member 57 in the horizontal direction of FIG. 6.

In this embodiment, the number of ground members 53' of the switching structure 100' is the same as the number of switching elements 15' of the switching structure 100', and each light-emitting element 17' is (electrically) connected to the corresponding switching element 15' through the respective conductive structure 65'. Therefore, the display device may not include the common conductive structure 65.

Figure 7A:
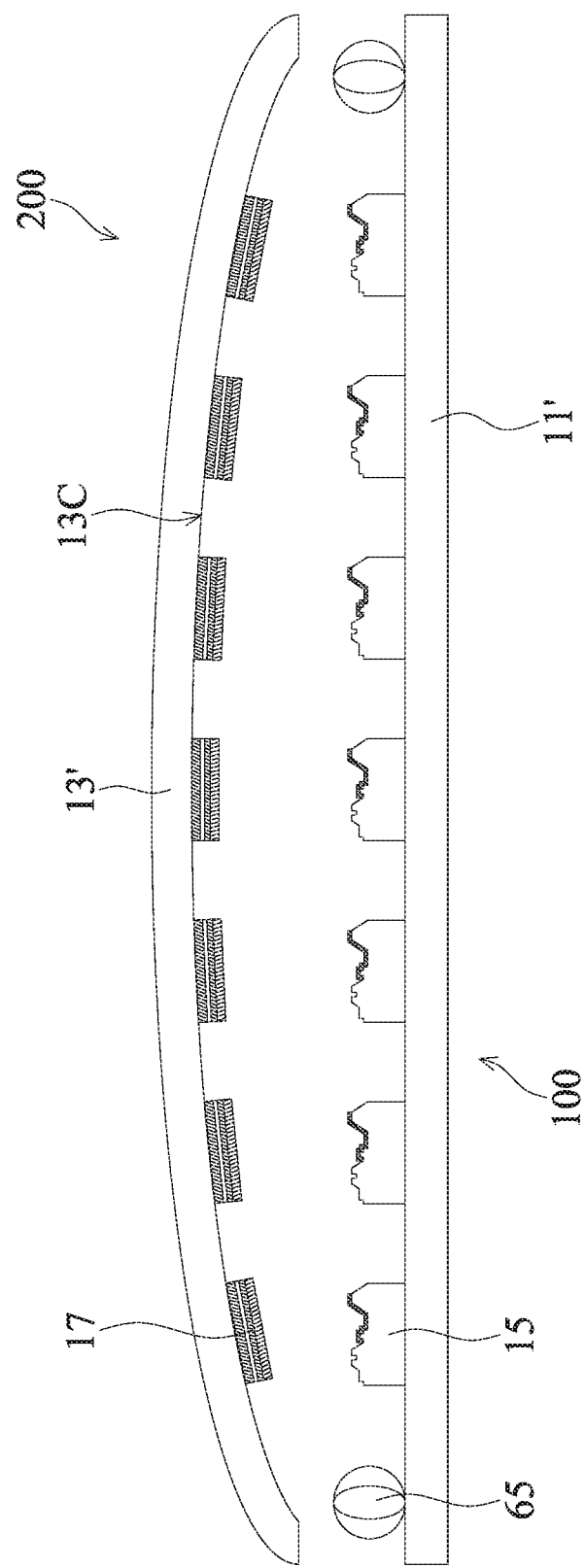
FIGS. 7A-7C are cross-sectional views illustrating various stages of combining the light-emitting structure and the switching structure according to one embodiment of the present disclosure.
Figure 7B:
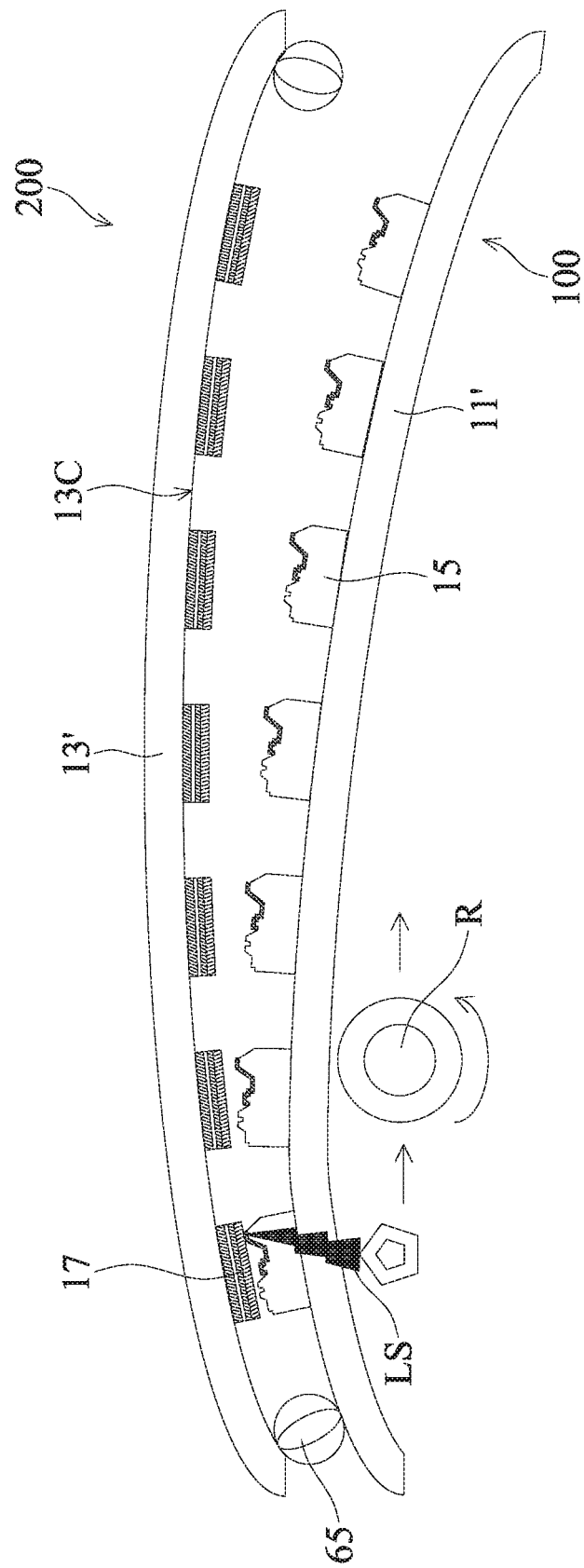
Figure 7C:
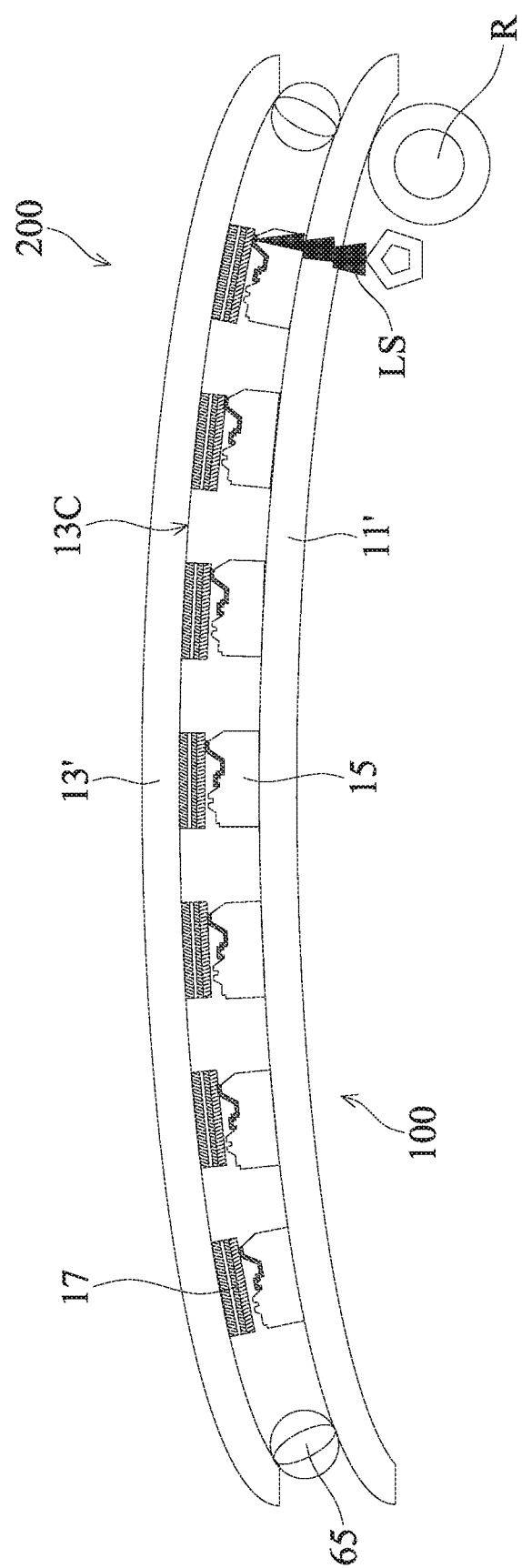

FIGS. 7A-7C are cross-sectional views illustrating various stages of combining the light-emitting structure 200 and the switching structure 100 according to one embodiment of the present disclosure. It should be noted that some components may be omitted in FIGS. 7A-7C in order to more clearly show the technical features of the embodiments of the present disclosure.

Referring to FIG. 7A, in this embodiment, the switching substrate 11' of the switching structure 100 may be a flexible substrate, and a plurality of switching elements 15 are disposed on the flexible switching substrate 11'. In this embodiment, the carrier substrate 13' of the light-emitting structure 200 is a curved rigid substrate, and a plurality of light-emitting elements 17 are disposed on a concave surface 13C of the curved carrier substrate 13'.

Then, referring to FIG. 7B and FIG. 7C, a plurality of switching elements 15 may be connected to the corresponding light-emitting elements 17 via the roller R and the laser LS, respectively, so that the light-emitting structure 200 and the switching structure 100 are combined. In this embodiment, a common conductive structure 65 may be disposed between the light-emitting structure 200 and the switching structure 100, but the present disclosure is not limited thereto.

Figure 8A:
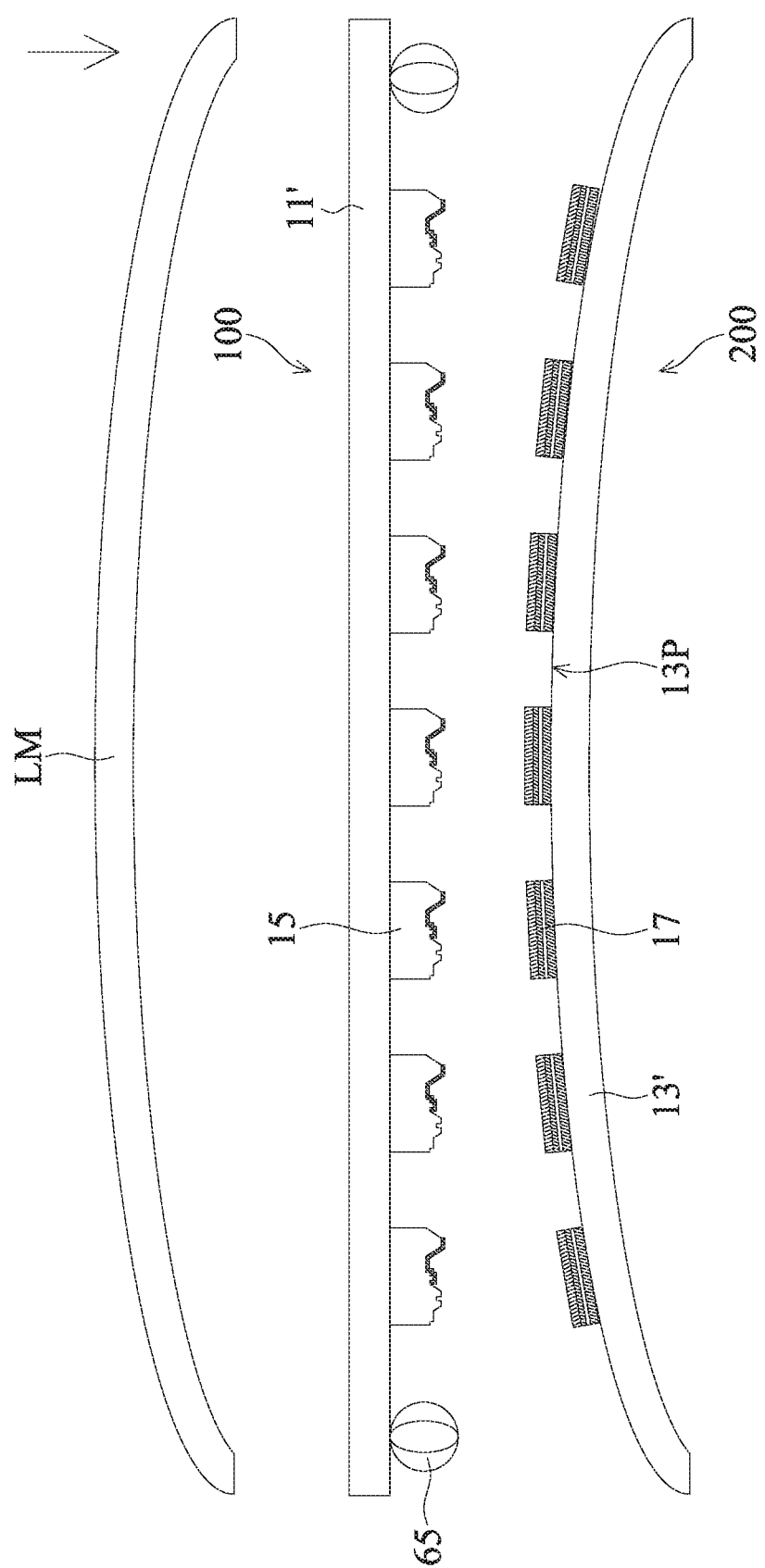
FIGS. 8A-8B are cross-sectional views illustrating various stages of combining the light-emitting structure and the switching structure according to another embodiment of the present disclosure.
Figure 8B:
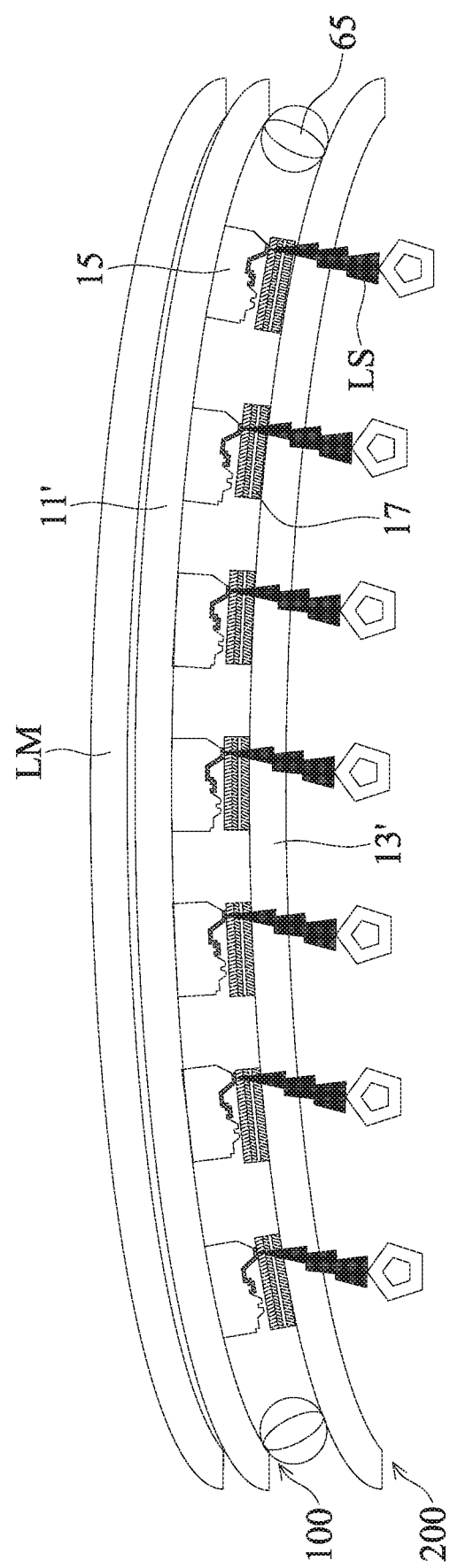

FIGS. 8A-8B are cross-sectional views illustrating various stages of combining the light-emitting structure 200 and the switching structure 100 according to another embodiment of the present disclosure. It should be noted that some components may be omitted in FIGS. 8A-8B in order to more clearly show the technical features of the embodiments of the present disclosure.

Referring to FIG. 8A, similarly, the switching substrate 11' of the switching structure 100 may be a flexible substrate, and a plurality of switching elements 15 are disposed on the flexible switching substrate 11'. In this embodiment, the carrier substrate 13' of the light-emitting structure 200 is a curved rigid substrate, and a plurality of light-emitting elements 17 are disposed on a convex surface 13P of the curved carrier substrate 13'. In addition, in this embodiment, a laminating machine LM may be used to combine the light-emitting structure 200 with the switching structure 100.

Referring to FIG. 8B, the switching structure 100 is placed in the laminating machine LM, and a plurality of switching elements 15 are respectively connected to the corresponding light-emitting elements 17 via the laser LS, so that the light-emitting structure 200 and the switching structure 100 are combined. Similarly, a common conductive structure 65 may be disposed between the light-emitting structure 200 and the switching structure 100, but the present disclosure is not limited thereto.

In summary, by the manufacturing method of the display device according to the embodiments of the present disclosure, the light-emitting structure may be stacked on the corresponding switching structure, and each light-emitting element may be connected to the corresponding switching element via a laser. Therefore, it may effectively reduce the size of a single pixel to achieve high resolution.

Moreover, since each light-emitting element is connected to the corresponding switching element via a laser in the manufacturing method of the display device according to the embodiments of the present disclosure, it does not require a complicated process or use more photomasks. As a result, a display device with high resolution may be completed at a lower manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A manufacturing method of a display device, comprising:

forming a switching structure, wherein the switching structure comprises a plurality of switching elements;
forming a plurality of first dummy conductive members, wherein each of the first dummy conductive members is adjacent to one of the switching elements;
forming a plurality of connecting members above the first dummy conductive members;
forming a light-emitting structure, wherein the light-emitting structure comprises a plurality of light-emitting elements;
arranging the light-emitting structure on the switching structure, so that each of the light-emitting elements is above each of the switching elements; and
connecting each of the light-emitting elements to a corresponding switching element by connecting the connecting members to the light-emitting elements via a laser, wherein each of the light-emitting elements is directly above each of the first dummy conductive members.

2. The manufacturing method of the display device as claimed in claim 1, wherein the step of forming the switching structure comprises:
providing a switching substrate;
forming a plurality of first conductive members on the switching substrate;
forming a first insulating layer on the first conductive members;
forming a plurality of first semiconductor layers on the first insulating layer;
forming a plurality of second conductive members and third conductive members on the first semiconductor layers;
forming a second insulating layer on the second conductive members and the third conductive members; and
forming the plurality of connecting members on the second insulating layer, wherein each of the connecting members is electrically connected to one of the second conductive members or one of the third conductive members;
wherein the first conductive members, the first insulating layer, the first semiconductor layers, the second conductive members, and the third conductive members define the switching elements, and each of the switching elements is connected to each of the connecting members.

3. The manufacturing method of the display device as claimed in claim 2, wherein the step of forming the switching structure further comprises:
forming at least one grounding member on the second insulating layer, wherein the at least one grounding member is electrically connected to the switching elements.

4. The manufacturing method of the display device as claimed in claim 3, wherein a top surface of each of the connecting members is higher than a top surface of the second insulating layer.

5. The manufacturing method of the display device as claimed in claim 3, wherein the step of forming the switching structure further comprises:
when forming the first conductive members, simultaneously forming the plurality of first dummy conductive members, wherein each of the first dummy conductive members is adjacent to one of the first conductive members;
when forming the semiconductor layer, simultaneously forming a plurality of dummy semiconductor layers on the first insulating layer, wherein each of the dummy semiconductor layers is formed correspondingly on one of the first dummy conductive members; and
when forming the second conductive members and the third conductive members, simultaneously forming a plurality of second dummy conductive members on the dummy semiconductor members;
wherein the second insulating layer is formed on the second dummy conductive members.

6. The manufacturing method of the display device as claimed in claim 3, wherein the step of forming the light-emitting structure comprises:
providing a carrier substrate;
forming a plurality of second semiconductor layers on the carrier substrate;
forming a plurality of active layers on the second semiconductor layers;
forming a plurality of third semiconductor layers on the active layers; and
forming a plurality of fourth conductive members on the third semiconductor layers;
wherein the second semiconductor layers, the active layers, the third semiconductor layers, and the fourth conductive members define the light-emitting elements, and each of the fourth conductive members is connected to each of the connecting members.

7. The manufacturing method of the display device as claimed in claim 6, further comprising:
forming a common conductive layer between the carrier substrate and the second semiconductor layers.

8. The manufacturing method of the display device as claimed in claim 7, wherein the at least one grounding member is electrically connected to the common conductive layer.

9. The manufacturing method of the display device as claimed in claim 3, wherein the step of forming the light-emitting structure comprises:
forming a common conductive layer;
forming a plurality of second semiconductor layers on the common conductive layer;
forming a plurality of active layers on the second semiconductor layers;
forming a plurality of third semiconductor layers on the active layers; and
forming a plurality of fourth conductive members on the third semiconductor layers;
wherein the second semiconductor layers, the active layers, the third semiconductor layers, and the fourth conductive members define the light-emitting structure, each of the fourth conductive members is connected to each of the connecting members, and the at least one grounding member is connected to the common conductive layer.

10. A manufacturing method of a display device, comprising:
forming a switching structure, wherein the switching structure comprises a plurality of switching elements;
forming a light-emitting structure, wherein the light-emitting structure comprises a plurality of light-emitting elements;
arranging the light-emitting structure on the switching structure, so that each of the light-emitting elements is above each of the switching elements; and
connecting each of the light-emitting elements to a corresponding switching element via a laser,
wherein the step of forming the switching structure comprises:
providing a switching substrate;

forming a plurality of first conductive members on the switching substrate;

forming a first insulating layer on the first conductive members;

forming a plurality of first semiconductor layers on the first insulating layer;

forming a plurality of second conductive members and third conductive members on the first semiconductor layers;

forming a second insulating layer on the second conductive members and the third conductive members;

forming a plurality of connecting members on the second insulating layer, wherein each of the connecting members is electrically connected to one of the second conductive members or one of the third conductive members; and forming at least one grounding member on the second insulating layer, wherein the at least one grounding member is electrically connected to the switching elements, wherein the first conductive members, the first insulating layer, the first semiconductor layers, the second conductive members, and the third conductive members define the switching elements, and each of the switching elements is connected to each of the connecting members.

* * * * *